(12) United States Patent
Shin

(10) Patent No.: US 10,650,897 B2
(45) Date of Patent: May 12, 2020

(54) STORAGE DEVICE AND METHOD FOR OPERATING THE SAME

(71) Applicant: SK hynix Inc., Gyeonggi-do (KR)

(72) Inventor: Beom Ju Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/162,772

(22) Filed: Oct. 17, 2018

(65) Prior Publication Data

US 2019/0295655 A1   Sep. 26, 2019

(30) Foreign Application Priority Data

Mar. 21, 2018 (KR) ........................ 10-2018-0032847

(51) Int. Cl.
| | | |
|---|---|---|
| *G11C 16/04* | (2006.01) | |
| *G11C 16/10* | (2006.01) | |
| *G11C 16/26* | (2006.01) | |
| *G06F 3/06* | (2006.01) | |

(52) U.S. Cl.
CPC .......... *G11C 16/102* (2013.01); *G06F 3/0614* (2013.01); *G06F 3/0658* (2013.01); *G06F 3/0673* (2013.01); *G11C 16/26* (2013.01)

(58) Field of Classification Search
CPC ..... G11C 16/102; G11C 3/061; G11C 3/0658; G11C 3/0673; G11C 16/24
See application file for complete search history.

(56) References Cited

U.S. PATENT DOCUMENTS

| | | | |
|---|---|---|---|
| 7,755,950 B2* | 7/2010 | Yu ........................ | G06F 11/1072 365/185.05 |
| 9,021,338 B2* | 4/2015 | Joo ........................ | H03M 13/05 714/773 |
| 2011/0271041 A1* | 11/2011 | Lee ...................... | G06F 12/0246 711/103 |

FOREIGN PATENT DOCUMENTS

| | | |
|---|---|---|
| KR | 1020150047394 | 5/2015 |
| KR | 1020150130638 | 11/2015 |

* cited by examiner

*Primary Examiner* — Pho M Luu
(74) *Attorney, Agent, or Firm* — IP & T Group LLP

(57) ABSTRACT

A storage device may perform a reprogram operation on a page on which a program operation is interrupted due to a sudden power off. The storage device may include a memory device including a plurality of memory blocks, each of which includes a plurality of pages, and a memory controller configured to perform a reprogram operation on a page in which a program operation is suspended using reprogram data that is set depending on threshold voltages of memory cells included in the page on which the program operation is interrupted, among the plurality of pages.

20 Claims, 26 Drawing Sheets

FIG. 6
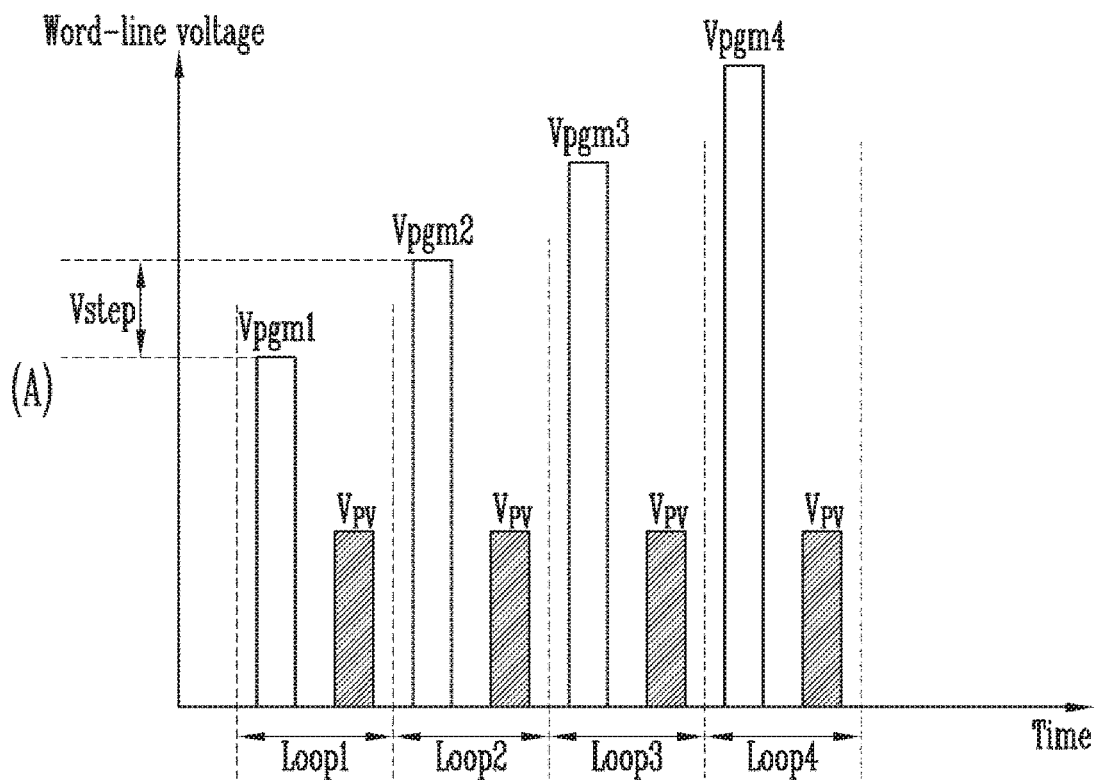
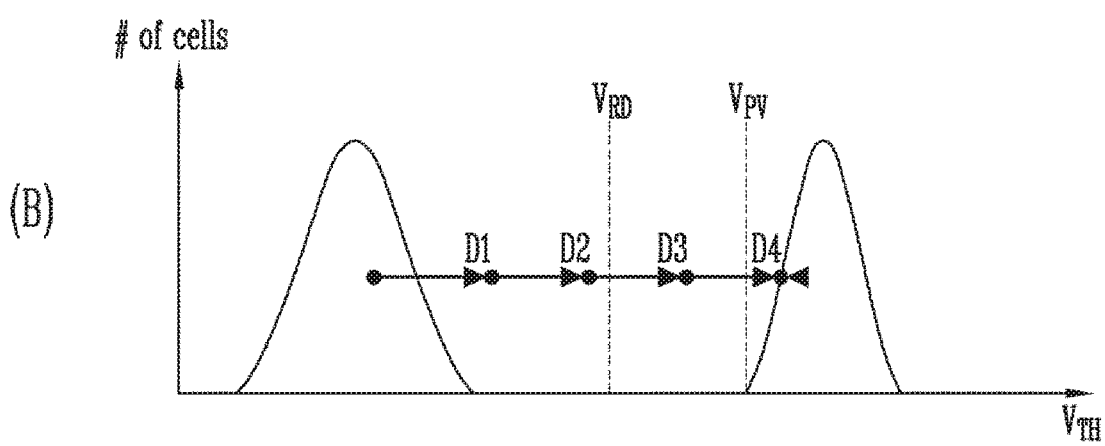

FIG. 10
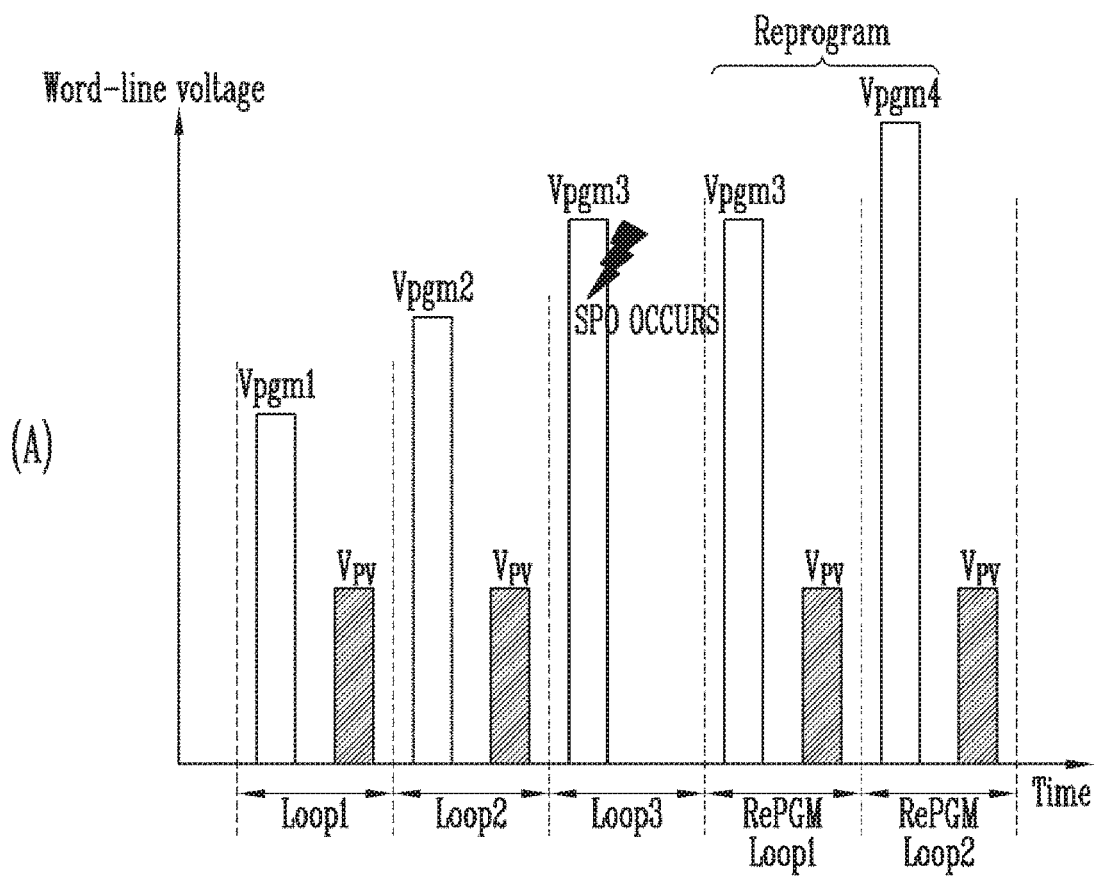
(A)
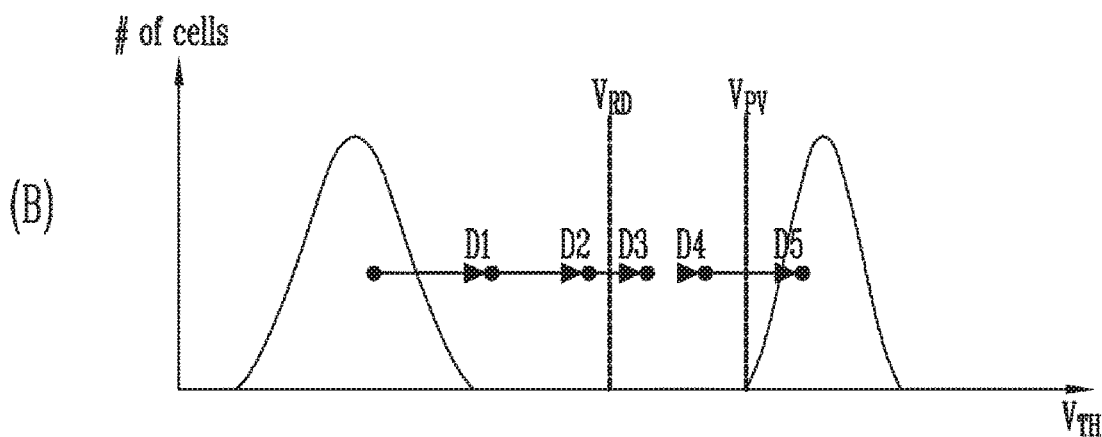
(B)

STORAGE DEVICE AND METHOD FOR OPERATING THE SAME

CROSS-REFERENCE TO RELATED APPLICATION

The present application claims priority under 35 U.S.C. § 119(a) to Korean patent application number 10-2018-0032847 filed on Mar. 21, 2018, the entire disclosure of which is incorporated herein by reference.

BACKGROUND

Field of Invention

Various embodiments of the present disclosure generally relate to an electronic device, and more particularly, to a storage device and a method for operating the storage device.

Description of Related Art

A storage device is a device which stores data under the control of a host device such as a computer, a smartphone, or a smartpad. Examples of the storage device include a device such as a hard disk drive (HDD) which stores data in a magnetic disk, and a device such as a solid state drive (SSD) or a memory card which stores data in a semiconductor memory, particularly, a nonvolatile memory.

The storage device may include a memory device in which data is stored and a memory controller which controls the storage of data in the memory device. Memory devices may be classified into a volatile memory and a nonvolatile memory. Representative examples of the nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a storage device, which performs a reprogram operation on a page on which a program operation is interrupted due to a sudden power off, and to a method for operating the storage device.

An embodiment of the present disclosure may provide for a storage device. The storage device may include a memory device including a plurality of memory blocks, each of which includes a plurality of pages, and a memory controller configured to perform a reprogram operation on a page on which a program operation is interrupted using reprogram data that is set depending on threshold voltages of memory cells included in the page on which the program operation is interrupted, among the plurality of pages.

An embodiment of the present disclosure may provide for a method for operating a storage device, the storage device including a memory device having a plurality of memory blocks, each of which includes a plurality of pages, and a memory controller for controlling the memory device. The method may include performing a read operation on a page on which a program operation is interrupted, among the plurality of pages, using a default read voltage, and performing a read operation using any one of a lower-read voltage and an upper-read voltage based on a result of the read operation using the default read voltage, and performing a reprogram operation based on a result of the read operation, wherein the lower-read voltage has a voltage level lower than that of the default read voltage and the upper-read voltage has a voltage level higher than that of the default read voltage.

An embodiment of the present disclosure may provide for a storage device. The storage device may include a memory device configured to perform a program operation of storing program data in a page selected from among a plurality of pages, and a memory controller configured to, when the program operation is interrupted due to a sudden power off, control the memory device such that any one of garbage data, the program data, and modified program data in which part of the program data is modified is stored in the selected page based on a result of reading the selected page using at least two of a default read voltage, a lower-read voltage having a voltage level lower than that of the default read voltage, and an upper-read voltage having a voltage level higher than that of the default read voltage.

An embodiment of the present disclosure may provide for a memory system. The memory system may include a memory device including a page; and a controller suitable for when the page is program-interrupted due to a sudden power off: controlling the memory device to perform a program operation to the page with original program data when threshold voltages of memory cells of the page are lower than a lower read voltage which is lower than one or more default read voltages; controlling the memory device to perform a program operation to the page with garbage data when threshold voltages are higher than the lower read voltage and lower than the default read voltages; and controlling the memory device to perform a program operation to the page with modified data when threshold voltages are higher than the default read voltages and lower than an upper read voltage which is higher than the default read voltages, wherein the controller generates the modified program data by changing the original program data to be stored in the memory cells, which are read as off-cells according to the upper read voltage, to have a value of '1'.

BRIEF DESCRIPTION OF THE DRAWINGS

FIG. 6 is a diagram for a program operation of a memory device.

FIG. 10 is a diagram illustrating a reprogram operation performed on a recoverable page in accordance with an embodiment of the present disclosure.

DETAILED DESCRIPTION

Figure 1:
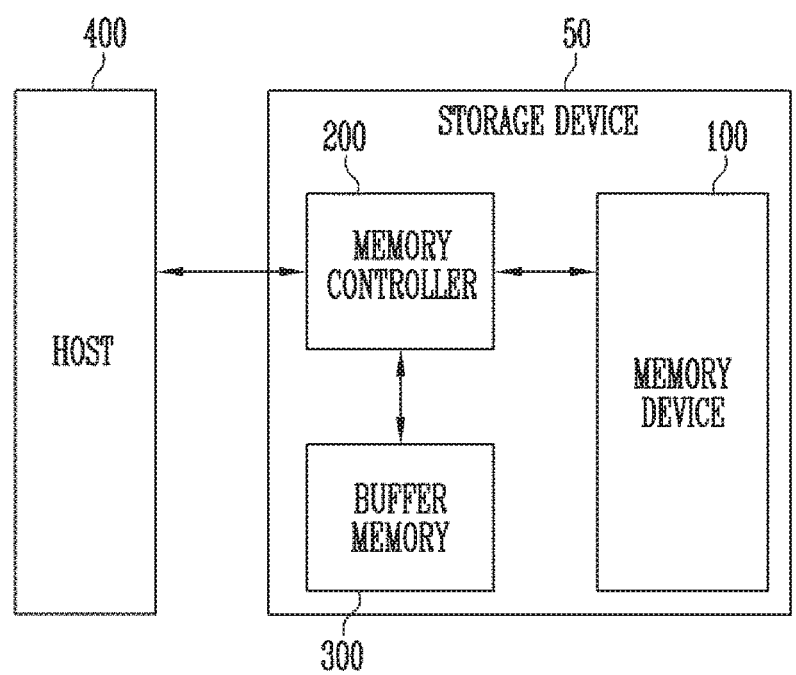
FIG. 1 is a block diagram illustrating a storage device in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present invention. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between," "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art, and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are illustrated, so that those of ordinary skill in the art can easily carry out the technical idea of the present disclosure.

FIG. 1 is a block diagram illustrating a storage device in accordance with an embodiment of the present disclosure.

Referring to FIG. 1, a storage device 50 may include a memory device 100, a memory controller 200, and a buffer memory 300.

The storage device 50 may be a device, such as a mobile phone, a smartphone, an MP3 player, a laptop computer, a desktop computer, a game console, a TV, a tablet PC, or an in-vehicle infotainment system, which stores data under the control of a host 400.

The storage device 50 may be manufactured as any one of various types of storage devices depending on a host interface which is a communication method with the host 400. For example, the storage device 50 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read. A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a Low Power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

In an embodiment, the memory device 100 may be implemented as a three-dimensional (3D) array structure. The present disclosure may also be applied not only to a flash memory device in which a charge storage layer is formed of a conductive floating gate (FG), but also to a charge trap flash (CTF) memory device in which a charge storage layer is formed of an insulating layer.

In an embodiment, each of the memory cells included in the memory device 100 may be implemented as a single-level cell (SLC) for storing a single data bit. Alternatively, each of the memory cells included in the memory device 100 may be implemented as a multi-level cell (MLC) for storing two data bits, a triple-level cell (TLC) for storing three data bits, or a quad-level cell (QLC) for storing four data bits.

The memory device 100 may receive a command and an address from the memory controller 200, and may access the area of the memory cell array, selected by the address. That is, the memory device 100 performs an operation corresponding to the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory controller 200 may control the overall operation of the storage device 50.

When power is applied to the storage device 50, the memory controller 200 may run firmware (FW). When the memory device 100 is a flash memory device, the memory controller 200 may run firmware such as a Flash Translation Layer (FTL) for controlling communication between the host 400 and the memory device 100.

In an embodiment, the memory controller 200 may receive data and logical block addresses (LBA) from the host 400, and may translate the logical block addresses (LBA) into physical block addresses (PBA) indicating the addresses of memory cells which are included in the memory device 100 and in which data is to be stored. Further, the memory controller 200 may store a logical-physical address mapping table, which configures mapping relationships between logical block addresses (LBA) and physical block addresses (PBA), in the buffer memory 300.

The memory controller 200 may control the memory device 100 so that a program operation, a read operation or an erase operation is performed in response to a request received from the host 400. During the program operation, the memory controller 200 may provide the memory device 100 with a program command, a physical block address (PBA), and data. During the read operation, the memory controller 200 may provide the memory device 100 with a read command and a physical block address (PBA). During the erase operation, the memory controller 200 may provide the memory device 100 with an erase command and a physical block address (PBA).

In an embodiment, the memory controller 200 may autonomously generate a program command, an address, and data without receiving a request from the host 400, and may transmit them to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control data exchange between the host 400 and the buffer memory 300. Alternatively, the memory controller 200 may temporarily store system data for controlling the memory device 100 in the buffer memory 300. For example, the memory controller 200 may temporarily store data, inputted from the host 400, in the buffer memory 300, and may then transmit the data, temporarily stored in the buffer memory 300, to the memory device 100.

In various embodiments, the buffer memory 300 may be used as a working memory or a cache memory of the memory controller 200. The buffer memory 300 may store codes or commands that are executed by the memory controller 200. Alternatively, the buffer memory 300 may store data that is processed by the memory controller 200.

In an embodiment, the buffer memory 300 may be implemented as a DRAM such as a double data rate SDRAM (DDR SDRAM), a DDR4 SDRAM, a low power double data rate fourth generation (LPDDR4) SDRAM, a graphics double data rate (GDDR) SDRAM, a low power DDR (LPDDR) SDRAM, or a Rambus DRAM (RDRAM), or as a static RAM (SRAM).

In various embodiments, the storage device 50 may not include the buffer memory 300. In this case, volatile memory devices disposed outside the storage device 50 may function as the buffer memory 300.

In an embodiment, the memory controller 200 may control at least two memory devices 100. Here, the memory controller 200 may control the memory devices 100 in an interleaving manner to improve operating performance.

The host 400 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
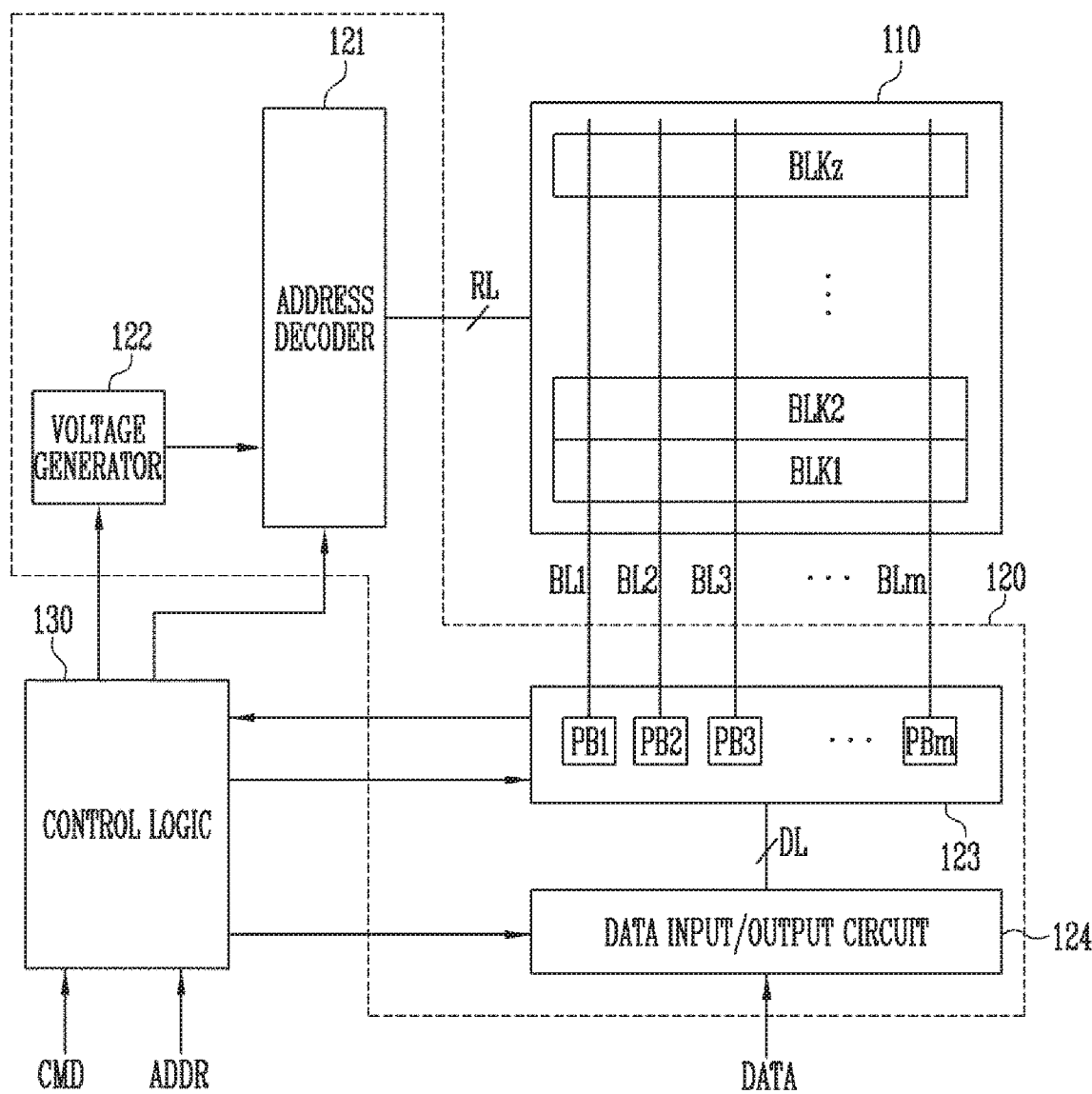
FIG. 2 is a diagram illustrating the structure of a memory device of FIG. 1.

FIG. 2 is a diagram illustrating the structure of the memory device 100 of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In an embodiment, each of the plurality of memory blocks BLK1 to BLKz included in the memory cell array 110 may include a plurality of dummy cells. As the dummy cells, one or more dummy cells may be coupled in series between a drain select transistor and the memory cells, and between a source select transistor and the memory cells.

Each of the memory cells of the memory device 100 may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, the read and write circuit 123, and a data input/output circuit 124.

The peripheral circuit 120 may drive the memory cell array 110.

For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 is configured to be operated under the control of the control logic 130. The address decoder 121 receives the address ADDR from the control logic 130.

The address decoder 121 is configured to decode a block address of the received address ADDR. The address decoder 121 selects at least one memory block from among the memory blocks BLK1 to BLKz in response to the decoded block address. The address decoder 121 is configured to decode a row address of the received address ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a program pass voltage having a level lower than that of the program voltage to unselected word lines. During a program verify operation, the address decoder 121 may apply a verify voltage to a selected word line and apply a verification pass voltage higher than the verify voltage to unselected word lines.

During a read operation, the address decoder 121 may apply a read voltage to a selected word line and apply a read pass voltage higher than the read voltage to unselected word lines.

In an embodiment, the erase operation of the memory device 100 may be performed on a memory block basis. During an erase operation, the address ADDR inputted to the memory device 100 includes a block address. The address decoder 121 may decode the block address and select a single memory block in response to the decoded block address. During the erase operation, the address decoder 121 may apply a ground voltage to word lines coupled to the selected memory block.

In an embodiment, the address decoder 121 may be configured to decode a column address of the received address ADDR. A decoded column address (DCA) may be transferred to the read and write circuit 123. In an exemplary embodiment, the address decoder 121 may include components such as a row decoder, a column decoder, and an address buffer.

The voltage generator 122 is configured to generate a plurality of voltages using an external supply voltage provided to the memory device 100. The voltage generator 122 is operated under the control of the control logic 130.

In an embodiment, the voltage generator 122 may generate an internal supply voltage by regulating the external supply voltage. The internal supply voltage generated by the voltage generator 122 is used as an operating voltage of the memory device 100.

In an embodiment, the voltage generator 122 may generate a plurality of voltages using an external supply voltage or an internal supply voltage. The voltage generator 122 may be configured to generate various voltages required by the memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage, and may generate a plurality of voltages by selectively activating the pumping capacitors under the control of the control logic 130.

The generated voltages may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data to be stored DATA through the data input/output circuit 124 and data lines DL.

During a program operation, the first to m-th page buffers PB1 to PBm may transfer the data, received through the data input/output circuit 124, to selected memory cells through the bit lines BL1 to BLm when a program pulse is applied to each selected word line. The memory cells in the selected page are programmed based on the transferred data. Memory cells coupled to a bit line to which a program permission voltage (e.g., a ground voltage) is applied may have increased threshold voltages. Threshold voltages of memory cells coupled to a bit line to which a program prohibition voltage (e.g., a supply voltage) is applied may be maintained. During a program verify operation, the first to m-th page buffers may read page data from the selected memory cells through the bit lines BL1 to BLm.

During a read operation, the read and write circuit 123 may read data DATA from the memory cells in the selected page through the bit lines BL, and may output the read data DATA to the data input/output circuit 124.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated under the control of the control logic 130.

The data input/output circuit 124 may include a plurality of input/output buffers (not illustrated) for receiving input data. During a program operation, the data input/output circuit 124 receives data to be stored DATA from an external controller (not illustrated). During a read operation, the data input/output circuit 124 outputs the data, received from the first to m-th page buffers PB1 to PBm included in the read and write circuit 123, to the external controller.

The control logic 130 may be coupled to the address decoder 121, the voltage generator 122, the read and write circuit 123, and the data input/output circuit 124. The control logic 130 may control the overall operation of the memory device 100. The control logic 130 may be operated in response to a command CMD received from an external device.

Figure 3:
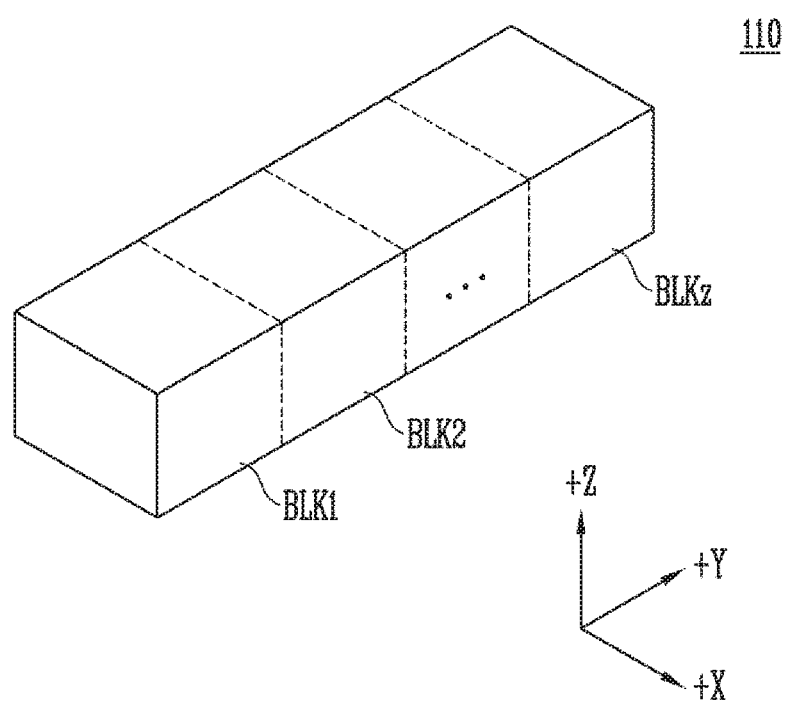
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional (3D) structure. Each memory block includes a plurality of memory cells stacked on a substrate. Such memory cells are arranged along a positive X (+X) direction, a positive Y (+Y) direction, and a positive Z (+Z) direction. The structure of each memory block will be described in detail below with reference to FIGS. 4 and 5.

Figure 4:
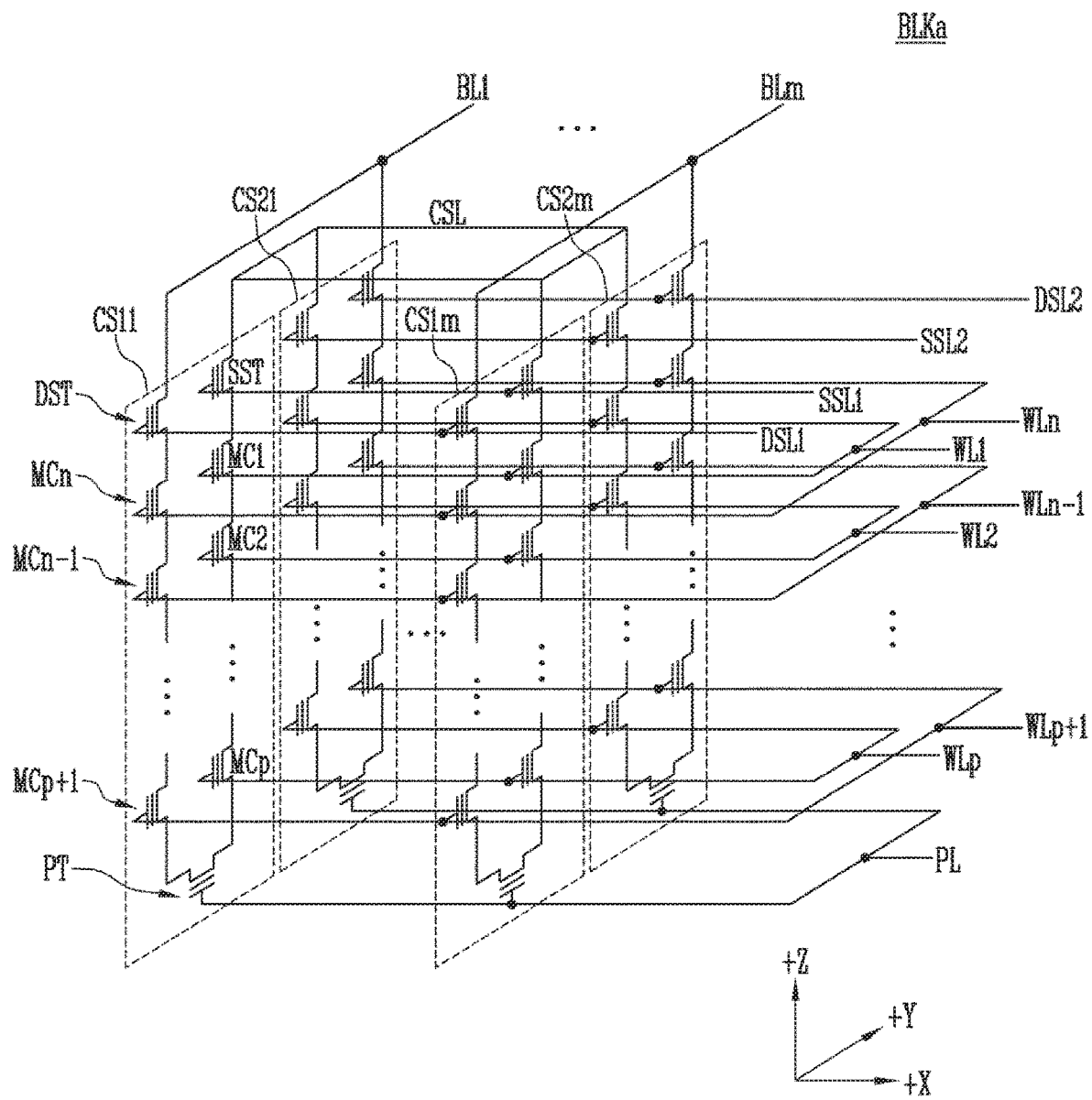
FIG. 4 is a circuit diagram illustrating any one memory block BLKa of memory blocks BLK1 to BLKz of FIG. 3.

FIG. 4 is a circuit diagram illustrating any one memory block BLKa of the memory blocks BLK1 to BLKz of FIG. 3.

Referring to FIG. 4, the memory block BLKa includes a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings are arranged in a row direction (i.e. a positive (+) X direction). In FIG. 4, two cell strings are illustrated as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 4, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extending in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extending in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
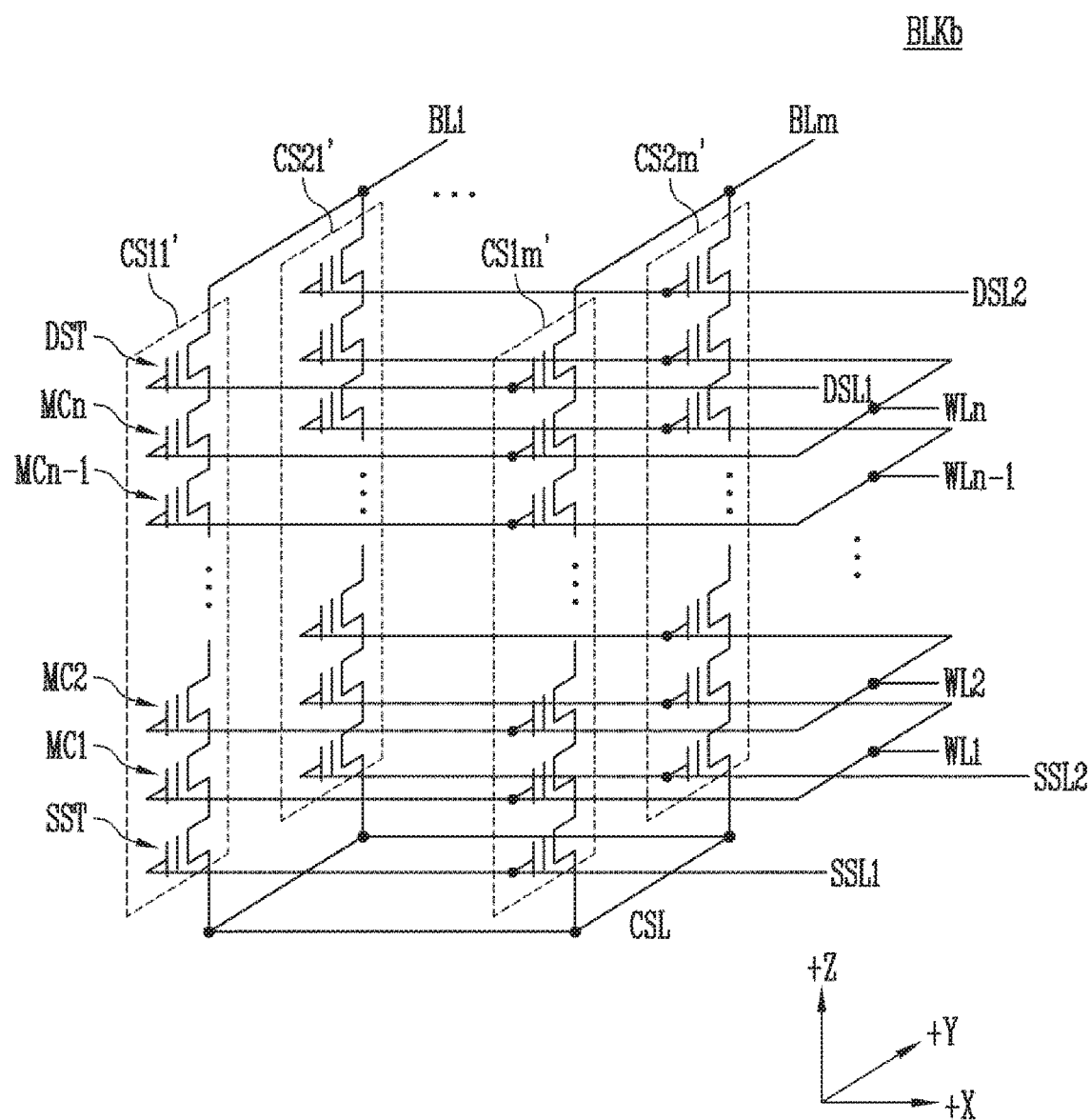
FIG. 5 is a circuit diagram illustrating an example of any one memory block BLKb of the memory blocks BLK1 to BLKz of FIG. 3.

FIG. 5 is a circuit diagram illustrating an example of any one memory block BLKb of the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a positive Z (+Z) direction. Each of the cell strings CS11' to CS1m' and CS21' to CS2m' includes at least one source select transistor SST, first to nth memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to nth memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has an equivalent circuit similar to that of the memory block BLKa of FIG. 4 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

FIG. 6 is a diagram for a program operation of a memory device.

In FIG. 6, (A) illustrates voltages applied to a selected word line on which a program operation is performed, and (B) illustrates changes in the threshold voltages of memory cells coupled to the selected word line as the voltages are applied as illustrated in (A).

Hereinafter, for convenience of description, each of a plurality of memory cells is assumed to be a single-level cell (SLC) which stores one bit of data. However, the scope of the present disclosure is not limited thereto, and each of the plurality of memory cells may be a multi-level cell (MLC) for storing two bits of data, a triple-level cell (TLC) for storing three bits of data or a quad-level cell (QLC) for storing four bits of data.

The program operation may be performed on a page basis. A plurality of memory cells coupled to a single word line may constitute a single page. That is, selected memory cells which are memory cells coupled to a selected word line may constitute a single selected page.

A program operation may include a plurality of program loops Loop1 to Loop4. That is, the selected memory cells may have threshold voltages corresponding to a target programmed state as the plurality of program loops Loop1 to Loop4 are performed.

Each of the plurality of program loops Loop1 to Loop4 may include a program voltage apply step for applying a program pulse and a verify step of verifying whether memory cells have been programmed by applying verify voltages.

For example, when the first program loop Loop1 is performed, a verify voltage VPV may be applied to the selected word line to verify the programmed states of the plurality of memory cells after a first program pulse Vpgm1 has been applied.

The memory cells which have passed a verification by the verify voltage VPV are determined to have the target programmed state. Thereafter, in the second program loop Loop2, the memory cells may be program inhibited. In order to program memory cells other than the program-inhibited memory cells, a second program pulse Vpgm2 which is higher than the first program pulse Vpgm1 by a step voltage Vstep, is applied in the second program loop Loop2. Thereafter, a verify step may be performed in the same way as the verify step in the first program loop Loop1. In an embodiment, the memory cells having passed a verification are memory cells having threshold voltages higher than the verify voltage VPV. Therefore, the memory cells having passed a verification are read as off-cells when the verify voltage VPV is applied. In contrast, memory cells having failed in a verification are read as on-cells when the verify voltage VPV is applied.

At the verify step, page buffers coupled to memory cells that are coupled to the selected word line may determine whether the memory cells have passed or failed in a verification, based on currents flowing through bit lines respectively coupled to the selected memory cells or voltages on the bit lines.

The target threshold voltage of each of the memory cells may be determined to be in any one of an erased state and a programmed state depending on data to be stored in the corresponding memory cell. Data of "1" may be stored in the memory cells having threshold voltages corresponding to the erased state. Data of "0" may be stored in the memory cells having threshold voltages corresponding to the programmed state.

The threshold voltages of memory cells before the first program loop Loop1 is performed, may correspond to the erased state. When the first program loop Loop1 is performed, the threshold voltages of memory cells having threshold voltages in the programmed state may increase to the state of D1. However, since the threshold voltages do not reach the target threshold voltages, that is, D4, the memory cells will fail in a verification. Thereafter, when the second program loop Loop2 is performed, the threshold voltages of memory cells having target threshold voltages corresponding to a programmed state may increase to the state of D2. However, since the threshold voltages do not reach the target threshold voltages, that is, D4, the memory cells will fail in a verification. Thereafter, when the third program loop Loop3 is performed, the threshold voltages of memory cells having target threshold voltages corresponding to a programmed state may increase to the state of D3. However, since the threshold voltages do not reach the target threshold voltages, that is, D4, the memory cells will fail in a verification. Thereafter, when the fourth program loop Loop4 is performed, the threshold voltages of memory cells having target threshold voltages corresponding to a programmed state may increase to the state of D4. Therefore, since the threshold voltages are higher than the verify voltage VPV, the memory cells may pass the verification.

The memory cells programmed to the state of D4 may be read using a default read voltage VRD. Since the threshold voltages of the memory cells programmed to the state of D4 are higher than the default read voltage VRD, the memory cells are read as off-cells. In contrast, memory cells in the erased state are read as on-cells. Therefore, data stored in the memory cells may be read depending on the default read voltage.

Figure 7:
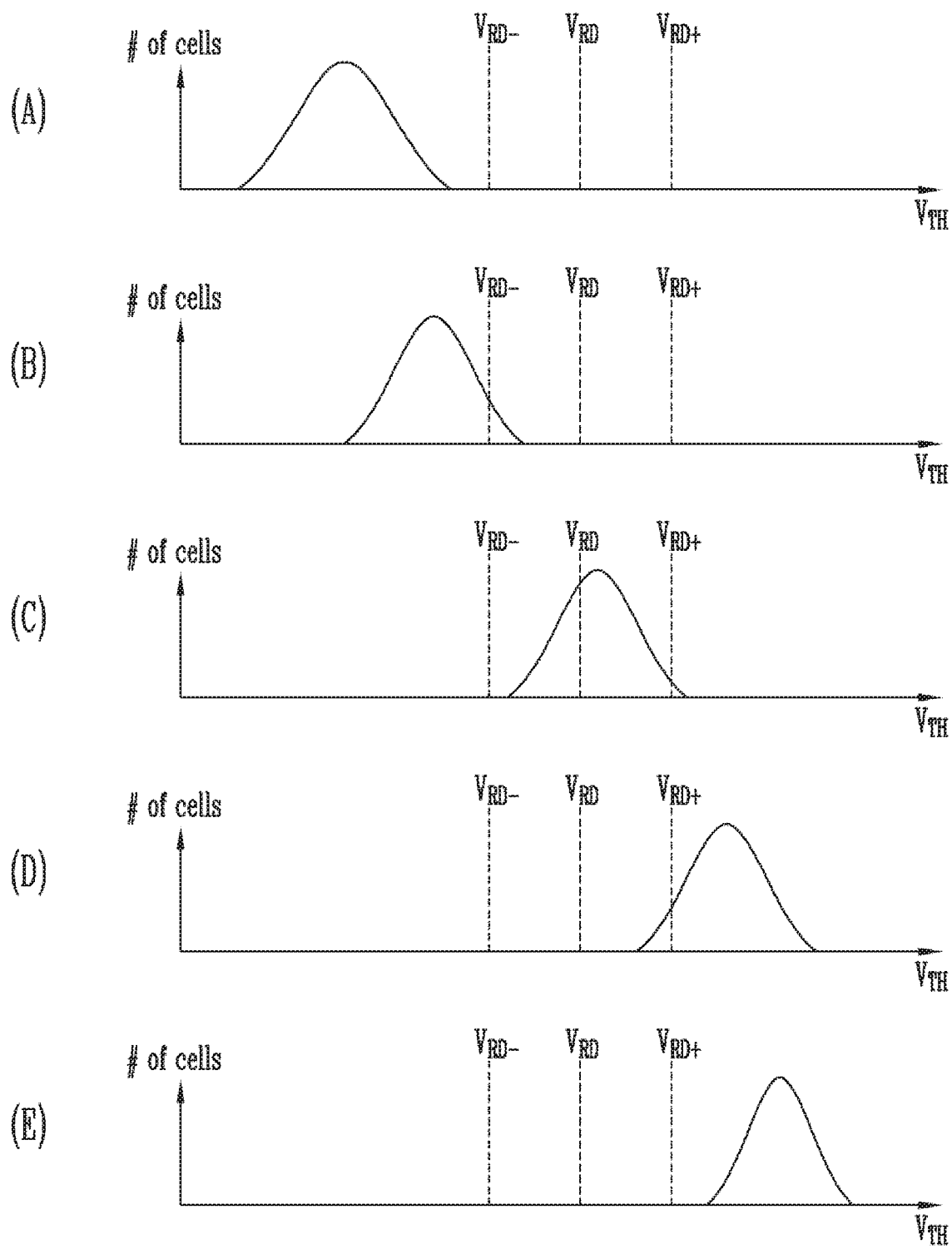
FIG. 7 is a diagram illustrating threshold voltage distributions of memory cells in a state in which a program operation is interrupted due to a sudden power off.

FIG. 7 is a diagram illustrating threshold voltage distributions of memory cells in a state in which a program operation is interrupted due to a sudden power off.

Referring to FIG. 7, the threshold voltages of memory cells coupled to a selected word line may be changed from a state as shown in (A) to a state as shown in (E) as program loops are performed. During the performance of a program operation, a sudden power off in which the supply of power to the storage device 50 is interrupted may occur, as described above with reference to FIG. 1. When the sudden power off occurs, the program operation which is being performed may be interrupted. Thereafter, when the supply of power is resumed, the storage device 50 may resume the program operation which was interrupted due to the sudden power off.

When the program operation is interrupted due to the sudden power off during the performance of the program operation, memory cells on which the program operation was being performed may have threshold voltages corresponding to any one of the states shown in (A) to (E).

The state in (A) indicates a case where a sudden power off occurs while the threshold voltages of the memory cells are in an erased state. That is, the memory cells having threshold voltages corresponding to the state in (A) may have the threshold voltages in the erased state. Therefore, whether the threshold voltages of the memory cells are in the state in (A) may be determined using a default read voltage VRD and a lower read voltage VRD− having a voltage level lower than the default read voltage VRD. For example, when the storage device reads a selected page using the default read voltage VRD, all memory cells may be read as on-cells. When error-correction code (ECC) decoding is performed on the read data, data stored in all of the memory cells may be treated as errors, and thus the read operation may fail. When the read operation fails, the storage device may read the selected page again using the lower read voltage VRD−. Here, when all of the memory cells are read as on-cells even using the lower read voltage VRD−, the storage device may determine that the memory cells have a threshold voltage distribution, such as the state in (A).

In an embodiment, when the number of erased cells is greater than the reference number of erased cells as a result of reading the memory cells included in the selected page using the lower read voltage VRD−, the storage device may determine that the memory cells have the threshold voltage distribution such as the state in (A). Here, the reference number of erased cells may be the maximum number of erased cells at which the selected memory cells can be determined to be in the erased state.

The state in (B) indicates a case where the threshold voltages of memory cells are increased compared to the state in (A). The threshold voltages of memory cells in the state in (B) may be lower than the default read voltage VRD. However, some memory cells may have threshold voltages higher than the lower read voltage VRD−. Whether the threshold voltages of memory cells are in the state in (B) may be determined using the default read voltage VRD and the lower read voltage VRD−. For example, when the storage device reads a selected page using the default read voltage VRD, all memory cells may be read as on-cells. When ECC decoding is performed on the read data, data stored in all of the memory cells may be treated as errors, and thus the read operation may fail. When the read operation fails, the storage device may read the selected page again using the lower read voltage VRD−. Here, when there are some memory cells read as off-cells, the storage device may determine that the memory cells have threshold voltages corresponding to the state in (B).

In an embodiment, when the number of erased cells is not greater than the reference number of erased cells as a result of reading the memory cells included in the selected page using the lower read voltage VRD−, the storage device may determine that the memory cells have a threshold voltage distribution such as the state in (B). Here, the reference number of erased cells may be the maximum number of erased cells at which the selected memory cells can be determined to be in the erased state.

The state in (C) indicates a case where the threshold voltages of memory cells are increased compared to the state in (B). In detail, when memory cells in the state in (C) are read using the default read voltage VRD, both memory cells read as on-cells and memory cells read as off-cells may be present. When ECC decoding is performed on the read data, the number of bits treated as errors may exceed the maximum number of correctable error bits, and thus the read operation may fail. When the read operation fails, the storage device may read the selected page again using the lower read voltage VRD−. Here, when memory cells read as off-cells are not present, the storage device may determine that the memory cells have threshold voltages corresponding to the state in (C).

In an embodiment, when the number of erased cells is not greater than the reference number of erased cells as a result of reading the memory cells included in the selected page using the lower read voltage VRD−, the storage device may determine that the memory cells have a threshold voltage distribution such as the state in (B). Here, the reference number of erased cells may be the maximum number of erased cells at which the selected memory cells can be determined to be in the erased state.

The state in (D) indicates a case where the threshold voltages of memory cells are increased compared to the state in (C). In detail, the storage device may determine whether the memory cells are in the state in (D) using both the default read voltage VRD and an upper read voltage VRD+ having a voltage level higher than the default read voltage VRD. In detail, when the memory cells having threshold voltages in the state in (D) are read using the default read voltage VRD, all memory cells may be read as off-cells. Therefore, since error bits are not present in the read data or since the number of bits treated as errors does not exceed the maximum number of correctable error bits, the memory cells may pass the read operation. When the read operation has passed, the storage device may read the selected page again using the upper read voltage VRD+.

In detail, when memory cells in the state in (D) are read using the upper read voltage VRD+, both memory cells read as on-cells and memory cells read as off-cells may be present. When ECC decoding is performed on the read data, the number of bits treated as errors may exceed the maximum number of correctable error bits, and thus the read operation will fail.

Therefore, when the read operation using the default read voltage VRD passes, and the read operation using the upper read voltage VRD+ fails, the storage device may determine that the memory cells have threshold voltages corresponding to the state in (D).

The state in (E) indicates that the threshold voltages of memory cells have already reached target threshold voltages. Therefore, the memory cells may be in a state identical to that of the case where the program operation is completed. In detail, the storage device may determine whether the memory cells are in the state in (E), using both the default read voltage VRD and the upper read voltage VRD+ having a level higher than the default read voltage VRD. Therefore, when both the read operation using the default read voltage VRD and the read operation using the upper read voltage VRD+ pass, the storage device may determine that the memory cells have threshold voltages corresponding to the state in (E). In this case, the storage device may determine that the program operation interrupted due to the sudden power off has passed.

Figure 8:
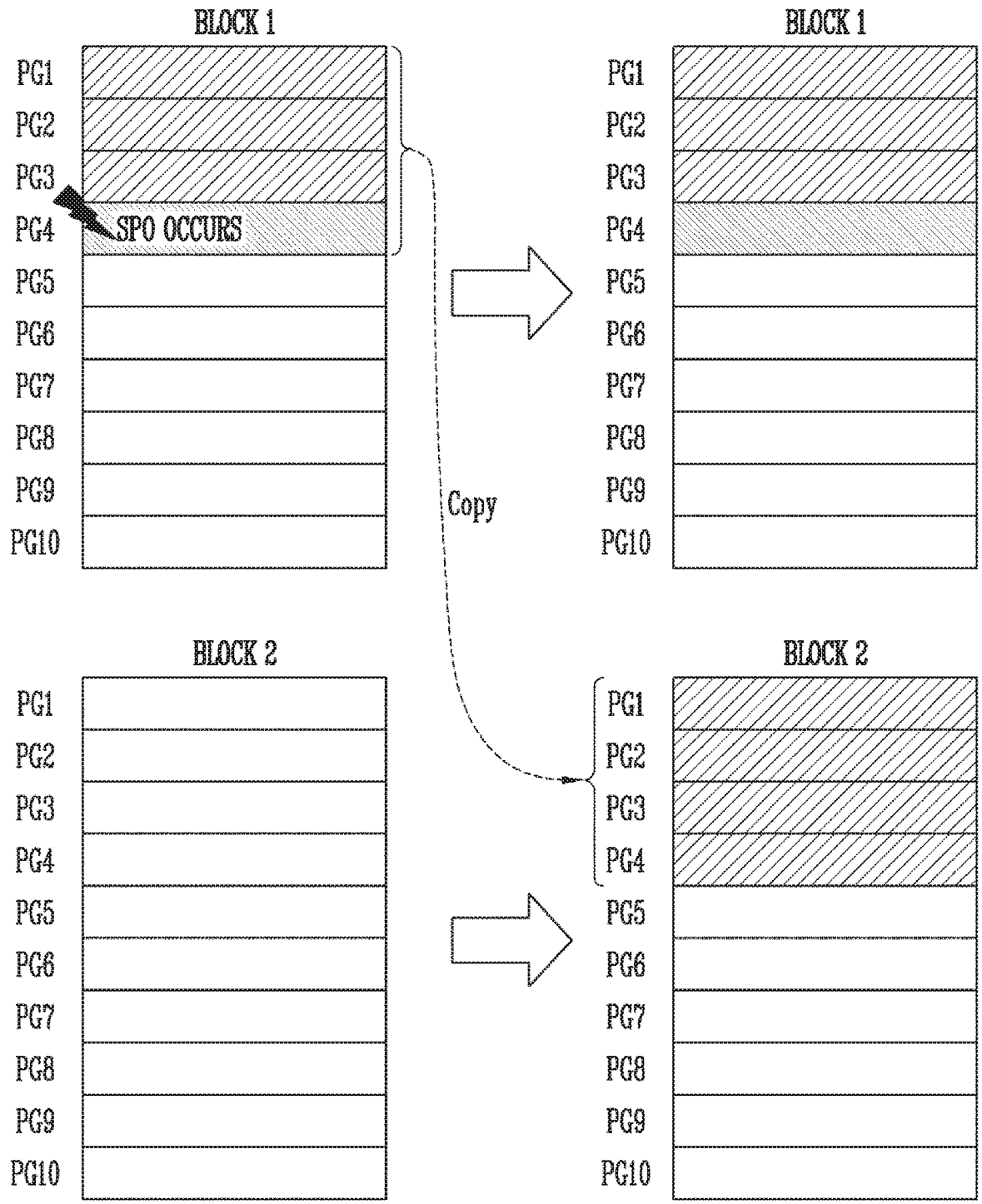
FIG. 8 is a diagram illustrating an embodiment for processing a recoverable page on which a program operation is interrupted when a sudden power off occurs.

FIG. 8 is a diagram illustrating an embodiment for processing a recoverable page on which a program operation is interrupted when a sudden power off occurs.

Referring to FIG. 8, each of a first memory block BLOCK1 and a second memory block BLOCK2 may include first to tenth pages PG1 to PG10.

FIG. 8 illustrates a case where a program operation on the first to third pages of the first memory block BLOCK1 has been completed, but a sudden power off (SPO) occurs while a program operation is being performed on the fourth page.

After the sudden power off has occurred, the storage device may recover data. In conventional technology, a reprogram operation was not performed on a page on which the program operation was interrupted, but which is recoverable, as in the case of the fourth page PG4 of the first memory block BLOCK1. Therefore, the storage device copies pieces of data in the first to fourth pages PG1 to PG4 of the first memory block BLOCK1 to the second memory block BLOCK2 which is a new memory block. A recoverable page may be a page in a state in which the read operation using the default read voltage passes, as in the case of the state in (D) described above with reference to FIG. 7.

In this case, a problem arises in that, even if the data in the program operation-interrupted page is recoverable, the second memory block BLOCK2, which is a new free block, is consumed.

For convenience of description, although a single memory block is described as including ten pages in FIG. 8, the embodiment of the present disclosure is not limited thereto.

Figure 9:
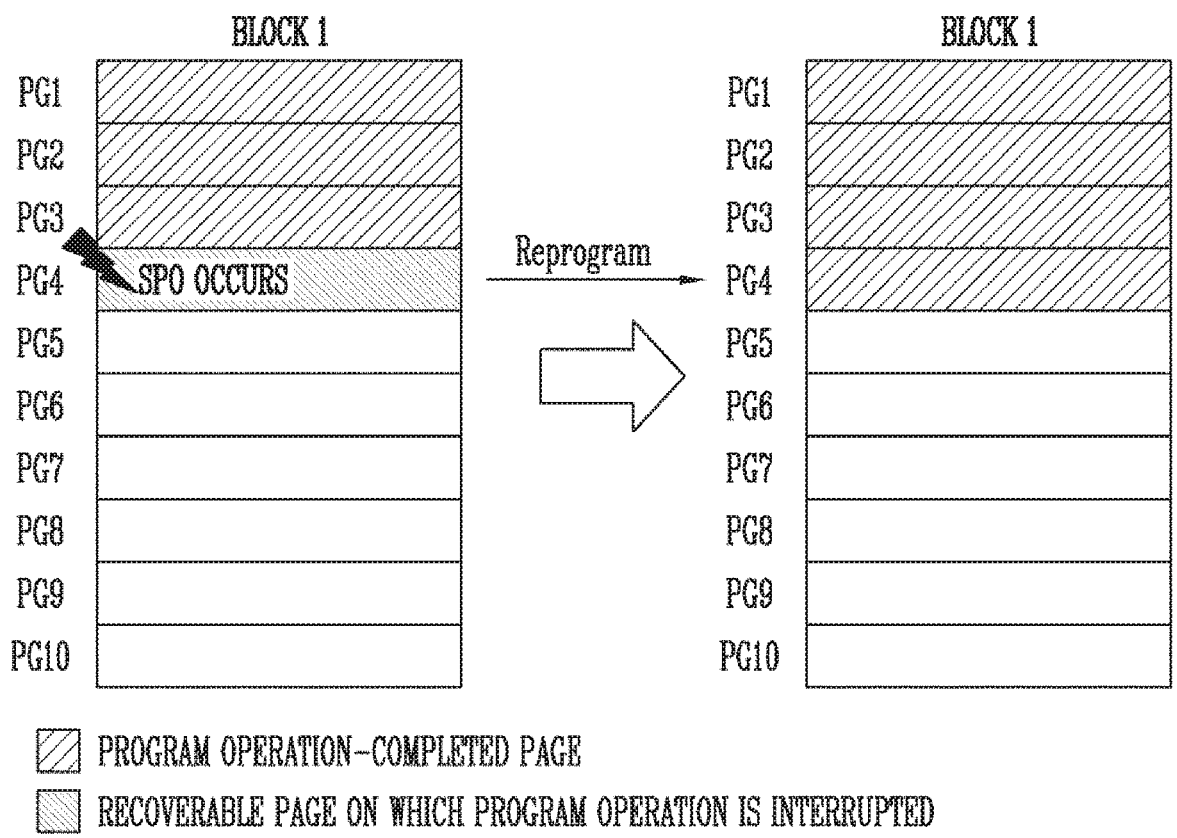
FIG. 9 is a diagram illustrating a method for processing a recoverable page in accordance with an embodiment of the present disclosure.

FIG. 9 is a diagram illustrating a method for processing a recoverable page in accordance with an embodiment of the present disclosure.

Referring to FIG. 9, each of a first memory block BLOCK1 and a second memory block BLOCK2 may include first to tenth pages PG1 to PG10.

FIG. 9 illustrates a case where a program operation on the first to third pages of the first memory block BLOCK1 has been completed, but a sudden power off (SPO) occurs while a program operation is being performed on the fourth page.

After the sudden power off has occurred, the storage device may recover data. In accordance with the embodiment of the present disclosure, a reprogram operation is performed on a page on which the program operation was interrupted, but which is recoverable, as in the case of the fourth page PG4 of the first memory block BLOCK1. A recoverable page may be a page in a state in which the read operation using the default read voltage passes, as in the case of the state in (D) described above with reference to FIG. 7.

Therefore, the storage device in accordance with the embodiment of the present disclosure may neither consume a second memory block BLOCK2, which is a new free block, nor perform a program operation for an unnecessary copy.

For convenience of description, although a single memory block is described as including ten pages in FIG. 9, the embodiment of the present disclosure is not limited thereto.

FIG. 10 is a diagram illustrating a reprogram operation performed on a recoverable page in accordance with an embodiment of the present disclosure.

Referring back to FIG. 7, memory cells in the state in (A) have threshold voltages before being increased, and thus the storage device may reprogram program data, which is data corresponding to a program operation interrupted due to a sudden power off, to a selected page. Therefore, the storage device may perform the reprogram operation of storing the program data in the selected page in the state in (A).

Since the threshold voltages of memory cells in the state in (B) cannot be accurately determined, a page including the memory cells in the state in (B) may be an irrecoverable page. Therefore, the storage device may process the selected page as a failed page by performing a reprogram operation of storing garbage data in the selected page. Thereafter, the storage device may perform a program operation of storing program data in another page.

Since the threshold voltages of memory cells in the state in (C) cannot be accurately determined, a page including the memory cells in the state in (C) may be an irrecoverable page. Therefore, the storage device may process the selected page as a failed page by performing a reprogram operation of storing garbage data in the selected page. Thereafter, the storage device may perform a program operation of storing program data in another page.

A page including memory cells in the state in (D) may be a recoverable page. The reason for this is that the threshold voltages of some memory cells have reached the state in (E) corresponding to target threshold voltages, and that the read operation using the default read voltage VRD has passed even in the current state (i.e., the state in (D)). Therefore, the storage device may complete the program operation, which was interrupted due to a sudden power off, by performing a reprogram operation on the selected page in the state in (D).

However, the threshold voltages of some of memory cells in the state in (D) have already reached the target threshold voltages. Accordingly, when a reprogram operation is performed using the same data as the program data, the memory cells, the threshold voltages of which have already reached the target threshold voltages, may be programmed to an over-programmed state in which the memory cells have threshold voltages higher than the target threshold voltages.

Therefore, the storage device may generate modified program data which is data to be programmed to the recoverable page. In detail, the storage device may generate modified program data by changing the program data to be stored in memory cells, which are read as off-cells as a result of reading using the upper read voltage VRD+, to have a value of '1'. The storage device may perform a reprogram operation on the selected page in the state in (D) by using the modified program data.

(A) of FIG. 10 illustrates voltages applied to a word line when a reprogram operation is performed on memory cells in the state in (D) of FIG. 7, and (B) of FIG. 10 illustrates changes to the threshold voltages of memory cells coupled to a selected word line as the voltages are applied as illustrated in (A) of FIG. 10.

In FIG. 10, it is assumed that a sudden power off occurs during the performance of a third program loop Loop3, and thus a program operation is interrupted. Therefore, at the time at which the sudden power off occurs, the threshold voltages of memory cells may be in a state corresponding to D3. In this case, the memory cells may pass the read operation using the default read voltage VRD, but may fail in the read operation using a verify voltage VPV or an upper read voltage VRD+, described above with reference to FIG. 7.

Here, the storage device may generate modified program data. In detail, the storage device may generate modified program data by changing the program data to be stored in memory cells, which are read as off-cells as a result of reading using the upper read voltage VRD+, to have a value of '1'. The storage device may perform a reprogram operation on the selected page in the state in (D) by using the modified program data.

As the reprogram operation is performed, the threshold voltages of memory cells may reach the state of D5 after passing through the state of D4.

Figure 11:
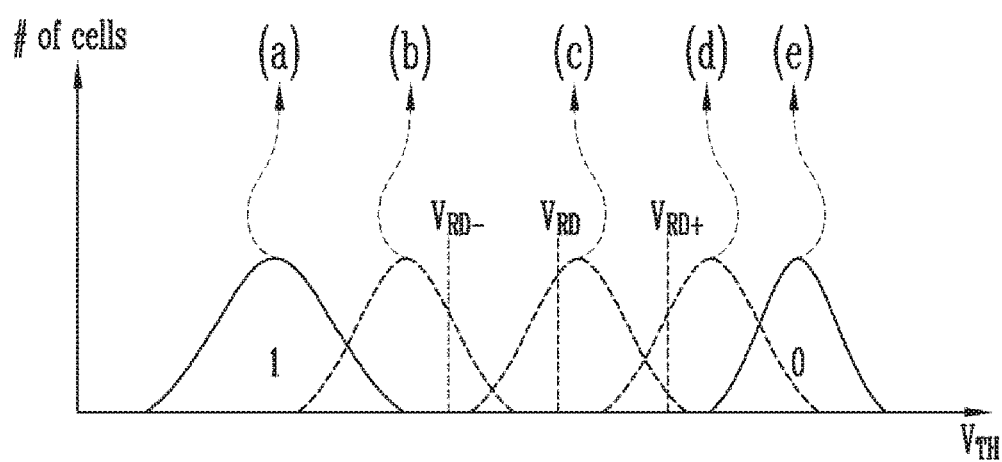
FIG. 11 is a diagram of read voltages applied during a recovery operation performed on a program-interrupted page in accordance with an embodiment of the present disclosure.

FIG. 11 is a diagram for read voltages applied during a recovery operation performed on a program-interrupted page in accordance with an embodiment of the present disclosure.

Referring to FIG. 11, the storage device may determine threshold voltage distributions of memory cells included in a page on which a program operation is interrupted in a recovery operation after a sudden power off has occurred. The storage device may determine which one of states (a) to (e) corresponds to a threshold voltage distribution of memory cells, based on a default read voltage VRD, a lower read voltage VRD−, and an upper read voltage VRD+.

A method by which the storage device performs a reprogram operation using the default read voltage VRD, the lower read voltage VRD−, and the upper read voltage VRD+ will be described in detail below with reference to embodiments in FIGS. 12 to 14.

Figure 12:
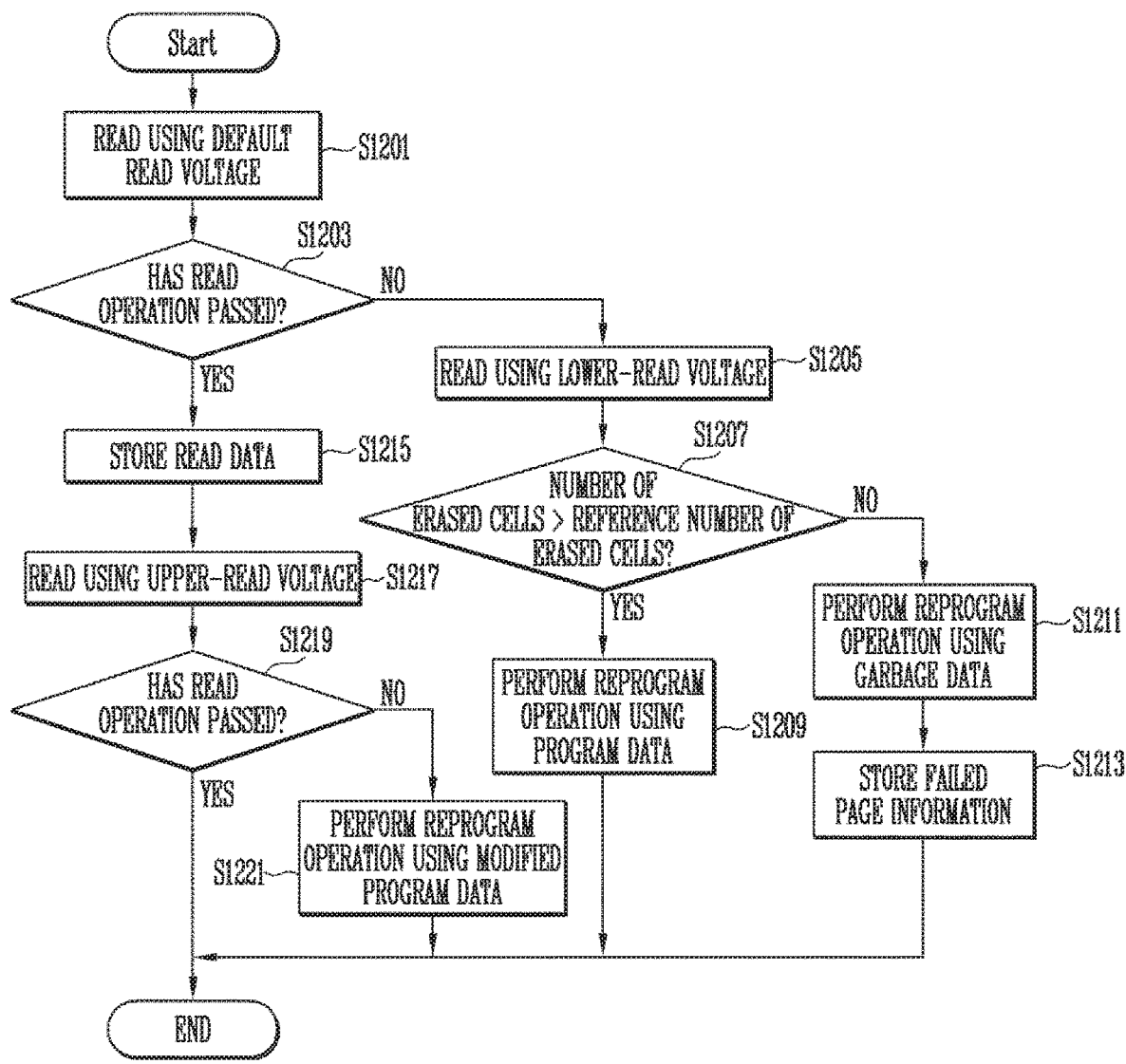
FIG. 12 is a flowchart illustrating a method for operating a storage device in accordance with an embodiment of the present disclosure.

FIG. 12 is a flowchart illustrating a method for operating a storage device in accordance with an embodiment of the present disclosure.

Referring to FIG. 12, at step S1201, the storage device may read a selected page using a default read voltage VRD.

At step S1203, the storage device may determine whether the read operation using the default read voltage VRD has passed. When it is determined that the read operation has passed, the process proceeds to step S1215, otherwise the process proceeds to step S1205.

At step S1205, when the read operation using the default read voltage VRD fails, the threshold voltages of the memory cells may correspond to the state in (A) or (B), described above with reference to FIG. 7. Therefore, the storage device may read the selected page using the lower read voltage VRD− having a voltage level lower than that of the default read voltage VRD.

At step S1207, the storage device may determine whether the number of erased cells that are memory cells corresponding to an erased state is greater than the reference number of erased cells as a result of reading using the lower read voltage VRD−. When the number of erased cells is greater than the reference number of erased cells, the process proceeds to step S1209, otherwise the process proceeds to step S1211.

When it is determined at step S1207 that the number of erased cells is greater than the reference number of erased cells, it can be seen that the storage device may determine that the threshold voltages of memory cells included in the corresponding page are in the erased state at step S1209. That is, the threshold voltages of the memory cells may correspond to the state in (A), described above with reference to FIG. 7. This may mean that the program operation is interrupted while the threshold voltages of memory cells included in the selected page are in the erased state. Accordingly, the storage device may reprogram program data, which is data corresponding to the program operation interrupted due to the sudden power off, to the selected page. Therefore, the storage device may perform the reprogram operation of storing the program data in the selected page.

When it is determined at step S1207 that the number of erased cells is not greater than the reference number of erased cells, it can be seen that at S1211, the threshold voltages of the memory cells correspond to the state in (B) or (C), described above with reference to FIG. 7. Therefore, the selected page may be an irrecoverable page. Therefore, the storage device may process the selected page as a failed page by performing a reprogram operation of storing garbage data in the selected page. Thereafter, the storage device may perform a program operation of storing program data in another page.

In an embodiment, the garbage data may be data for which the read operation on a failed page, which is a page to which garbage data is programmed, always fails. In various embodiments, the garbage data may be generated such that program disturbance is minimized. That is, the garbage data may be data that minimizes the occurrence of program disturbance, among pieces of data which guarantee a failure in a read operation on the failed page. For example, the garbage data may be data in which all pieces of data have a value of '1'.

At step S1213, the storage device may store failed page information indicating that the selected page is a failed page. In an embodiment, the failed page information may be stored in a spare area of the failed page or in a system information area of a memory block including the failed page.

At step S1215, the storage device may store data which is read using the default read voltage VRD. The stored data may be program data which was being programmed before the sudden power off occurs.

At step S1217, the storage device may read the selected page using an upper read voltage VRD+.

At step S1219, the storage device may determine whether the read operation using the upper read voltage VRD+ has passed. When it is determined that the read operation has passed, the corresponding program operation is considered to be completed and is then terminated because the sudden power off has occurred after the threshold voltages of the memory cells reached target threshold voltages. When the read operation fails, the process proceeds to step S1221.

At step S1221, the storage device may generate modified program data. In detail, the storage device may generate modified program data by changing the program data to be stored in memory cells, which are read as off-cells as a result of reading using the upper read voltage VRD+, to have a value of '1'. The storage device may perform a reprogram operation on the selected page using the modified program data.

Figure 13:
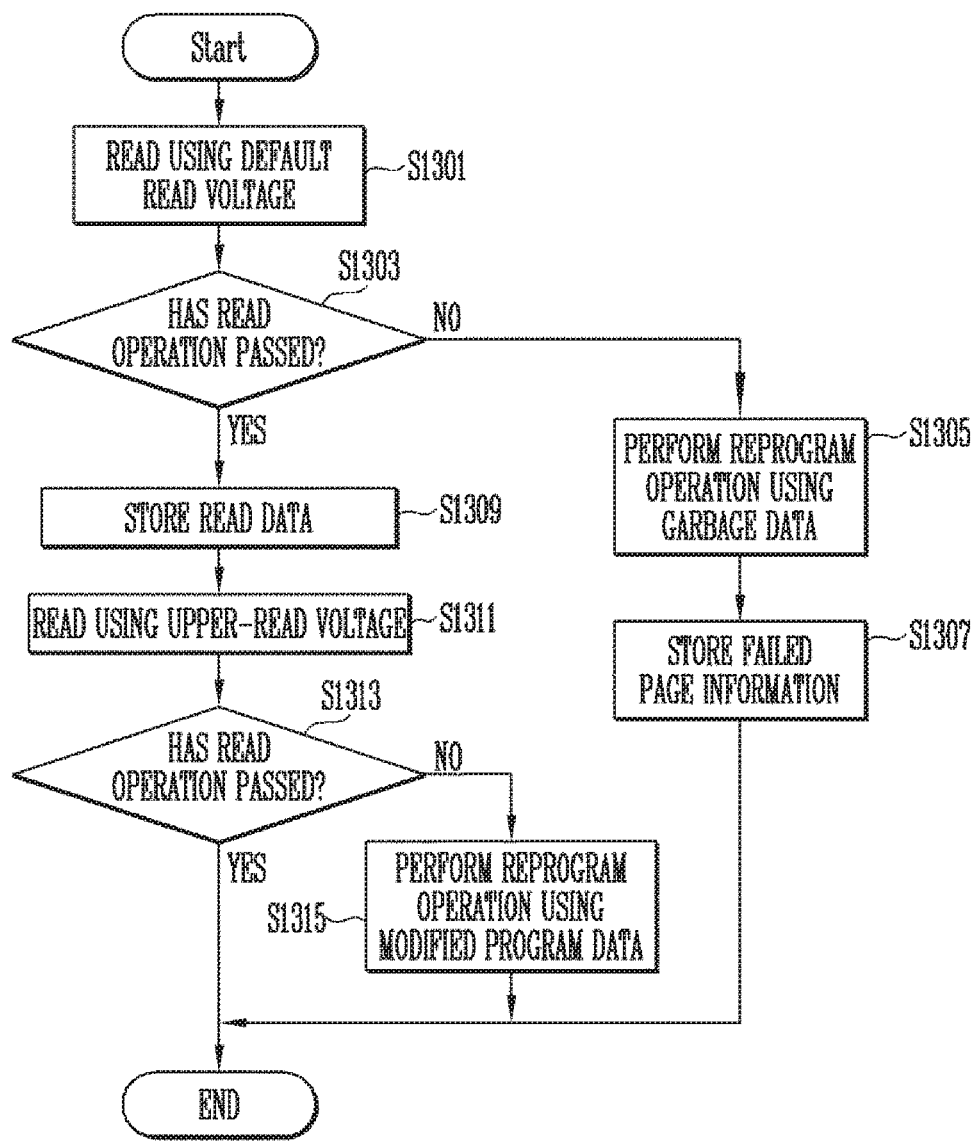
FIG. 13 is a flowchart illustrating a method for operating a storage device in accordance with an embodiment of the present disclosure.

FIG. 13 is a flowchart illustrating a method for operating a storage device in accordance with an embodiment of the present disclosure.

Referring to FIG. 13, at step S1301, the storage device may read a selected page using a default read voltage VRD.

At step S1303, the storage device may determine whether the read operation using the default read voltage VRD has passed. When it is determined that the read operation has passed, the process proceeds to step S1309, otherwise the process proceeds to step S1305.

At step S1305, the storage device may process the selected page as a failed page by performing a reprogram operation of storing garbage data in the selected page. Thereafter, the storage device may perform a program operation of storing program data in another page. In detail, when the read operation using the default read voltage VRD fails, the storage device may determine that the threshold voltages of memory cells correspond to any one of states in (A), (B), and (C) described above with reference to FIG. 7. That is, when the read operation using the default read voltage VRD fails, the storage device may determine the corresponding page to be an irrecoverable page, and may perform a reprogram operation of storing garbage data.

At step S1307, the storage device may store failed page information indicating that the selected page is a failed page. In an embodiment, the failed page information may be stored in a spare area of the failed page or in a system info area of a memory block including the failed page.

At step S1309, the storage device may store data which is read using the default read voltage VRD. The stored data may be program data which was being programmed before a sudden power off occurs.

At step S1311, the storage device may read the selected page using an upper read voltage VRD+.

At step S1313, the storage device may determine whether the read operation using the upper read voltage VRD+ has passed. When it is determined that the read operation has passed, the corresponding program operation is considered to be completed and is then terminated because the sudden power off has occurred after the threshold voltages of the memory cells reached target threshold voltages. When the read operation fails, the process proceeds to step S1315.

At step S1315, the storage device may generate modified program data. In detail, the storage device may generate modified program data by changing the program data to be stored in memory cells, which are read as off-cells as a result of reading using the upper read voltage VRD+, to have a value of '1'. The storage device may perform a reprogram operation on the selected page using the modified program data.

Figure 14:
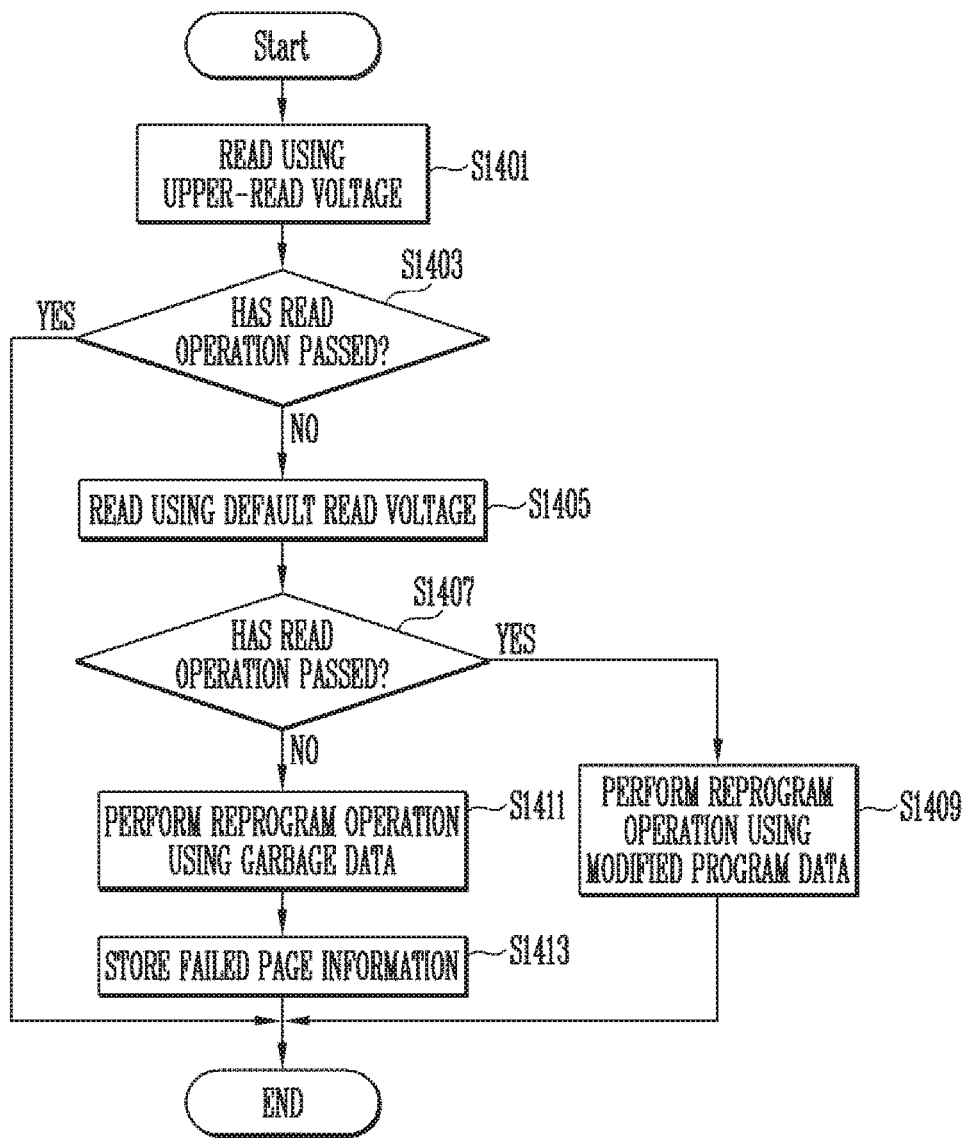
FIG. 14 is a flowchart illustrating a method for operating a storage device in accordance with an embodiment of the present disclosure.

FIG. 14 is a flowchart illustrating a method for operating a storage device in accordance with an embodiment of the present disclosure.

Referring to FIG. 14, at step S1401, the storage device may read a selected page using an upper read voltage VRD+.

At step S1403, the storage device may determine whether the read operation using the upper read voltage VRD+ has passed.

When it is determined that the read operation has passed, it may be considered that a program operation on memory cells included in the corresponding page has been normally terminated, and thus the program operation may be terminated. When it is determined that the read operation has failed, the process proceeds to step S1405.

At step S1405, the storage device may read the selected page using a default read voltage VRD.

At step S1407, the storage device may determine whether the read operation using the default read voltage VRD has passed. When it is determined that the read operation has passed, the process proceeds to step S1409, otherwise the process proceeds to step S1411.

At step S1409, the storage device may generate modified program data. In detail, the storage device may generate modified program data by changing the program data to be stored in memory cells, which are read as off-cells as a result of reading using the default read voltage VRD, to have a value of '1'. The storage device may perform a reprogram operation on the selected page using the modified program data.

At step S1411, the storage device may process the selected page as a failed page by performing a reprogram operation of storing garbage data in the selected page. Thereafter, the storage device may perform a program operation of storing program data in another page. In detail, when the read operation using the default read voltage VRD fails, the storage device may determine that the threshold voltages of memory cells correspond to any one of states in (A), (B), and (C) described above with reference to FIG. 7. That is, when the read operation using the default read voltage VRD fails, the storage device may determine the corresponding page to be an irrecoverable page, and may perform the reprogram operation of storing garbage data.

At step S1413, the storage device may store failed page information indicating that the selected page is a failed page. In an embodiment, the failed page information may be stored in a spare area of the failed page or in a system info area of a memory block including the failed page.

Figure 15:
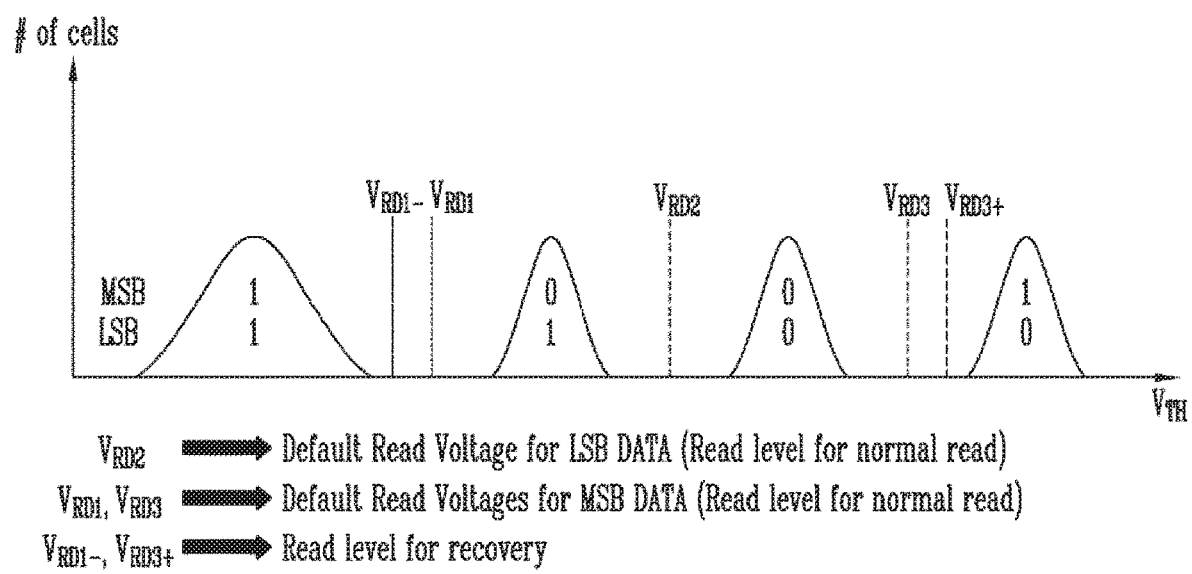
FIG. 15 is a diagram illustrating read voltages applied during a recovery operation performed on a program-interrupted page in accordance with an embodiment of the present disclosure.

FIG. 15 is a diagram illustrating read voltages applied during a recovery operation performed on a program-interrupted page in accordance with an embodiment of the present disclosure.

FIG. 15 illustrates read voltages used to recover a program operation when a program operation on a page composed of MLCs for storing two bits in each memory cell is interrupted.

In the case of MLCs, each of the memory cells stored in the page may be programmed to have a threshold voltage corresponding to any one of "11", "01", "00", and "10".

Here, between the two bits of data stored in the memory cells included in the corresponding page, Least Significant Bit (LSB) data may be LSB data, and Most Significant Bit (MSB) data may be MSB data. Data may be read from the page composed of MLCs using three default read voltage VRDs. In detail, the storage device may read data using a default LSB read voltage VRD2 and default MSB read voltages VRD1 and VRD3. First, the storage device may read LSB data using the default LSB read voltage VRD2. Thereafter, the storage device may identify memory cells corresponding to data "11" and "01" by performing a read operation using a first default MSB read voltage VRD1, having a voltage lower level, of the default MSB read voltages VRD1 and VRD3. Thereafter, the storage device may identify memory cells corresponding to data "00" and "10" by performing a read operation using the second default MSB read voltage VRD3, having a higher voltage level, of the default MSB read voltages VRD1 and VRD3.

In an embodiment of the present disclosure, the storage device may determine the threshold voltage distribution of memory cells included in a program-interrupted page in a recovery operation after a sudden power off has occurred. The storage device may determine a threshold voltage distribution of memory cells using the default LSB read voltage VRD2, the default MSB read voltages VRD1 and VRD3, a lower MSB read voltage VRD1− having a voltage level lower than that of the first default MSB read voltage VRD1, and an upper MSB read voltage VRD3+ having a voltage level higher than that of the second default MSB read voltage VRD3.

A method by which the storage device performs a reprogram operation using the default LSB read voltage VRD2, the default MSB read voltages VRD1 and VRD3, the lower MSB read voltage VRD1− having a voltage level lower than that of the first default MSB read voltage VRD1, and the upper MSB read voltage VRD3+ having a voltage level higher than that of the second default MSB read voltage VRD3 will be described in detail below with reference to the embodiments in FIGS. 16 to 18.

Figure 16:
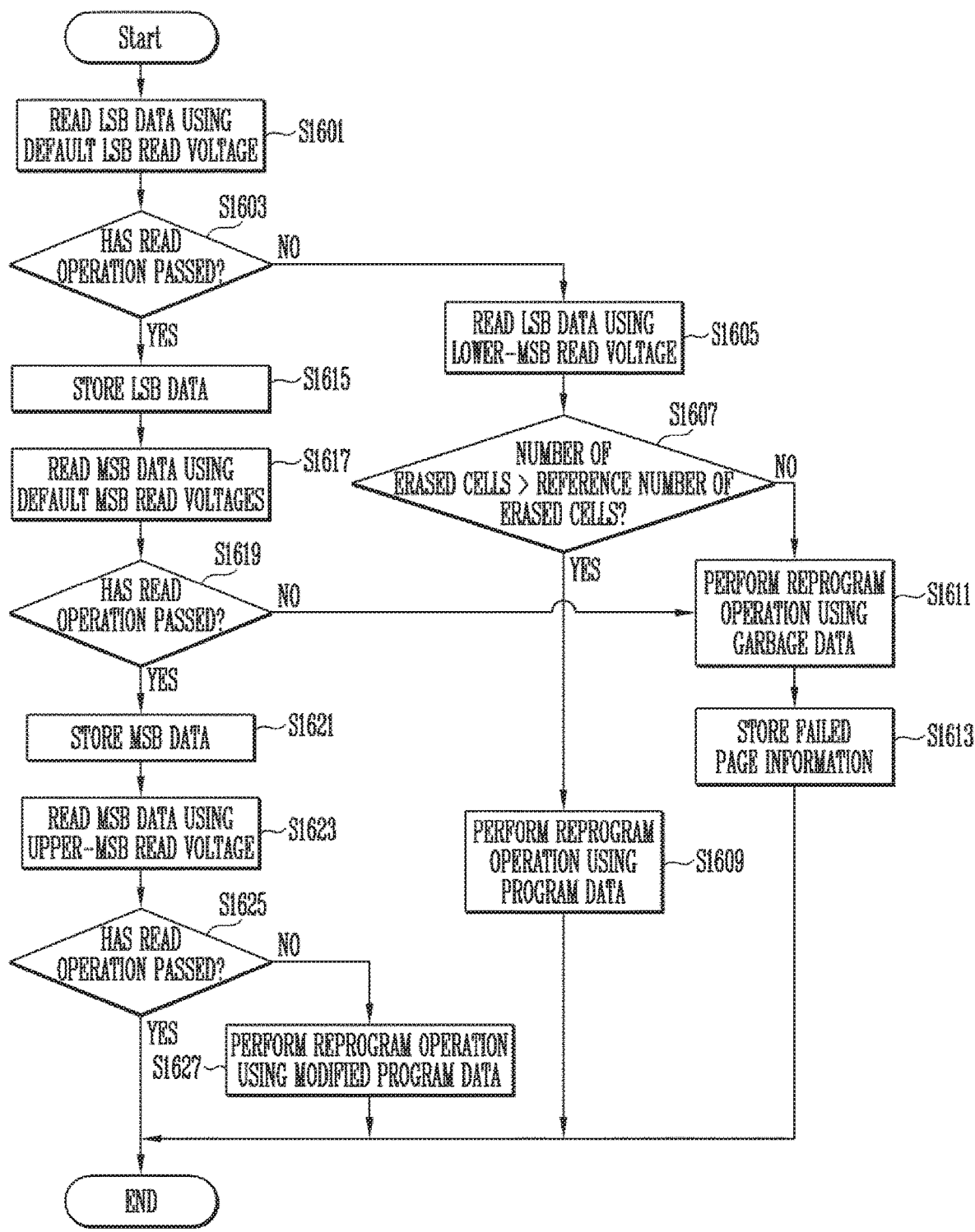
FIG. 16 is a flowchart illustrating a method for operating a storage device in accordance with an embodiment of the present disclosure.

FIG. 16 is a flowchart illustrating a method for operating a storage device in accordance with an embodiment of the present disclosure.

Referring to FIG. 16, at step S1601, the storage device may read a selected page using a default LSB read voltage VRD2.

At step S1603, the storage device may determine whether the read operation using the default LSB read voltage VRD2 has passed. When it is determined that the read operation has passed, the process proceeds to step S1615, otherwise the process proceeds to step S1605.

When the read operation using the default LSB read voltage VRD2 fails, the threshold voltage of each of memory cells may have a voltage level corresponding to data of "11" or "01" at step S1605. The storage device may read the selected page using the lower MSB read voltage VRD1− having a voltage level lower than that of the first default MSB read voltage VRD1.

At step S1607, the storage device may determine whether the number of erased cells that are memory cells corresponding to an erased state is greater than the reference number of erased cells as a result of reading using the lower MSB read voltage VRD1−. When the number of erased cells is greater than the reference number of erased cells, the process proceeds to step S1609, otherwise the process proceeds to step S1611.

When it is determined at step S1607 that the number of erased cells is greater than the reference number of erased cells, it can be seen that the storage device may determine that the threshold voltages of memory cells included in the corresponding page are in the erased state at step S1609. That is, this may be the state in which all of the memory cells have threshold voltages corresponding to data of "11". This may mean that a program operation is interrupted while the threshold voltages of memory cells included in the selected page are in the erased state. Accordingly, the storage device may reprogram program data, which is data corresponding to the program operation interrupted due to a sudden power off, to the selected page. Therefore, the storage device may perform the reprogram operation of storing the program data in the selected page.

When it is determined at step S1607 that the number of erased cells is not greater than the reference number of erased cells, it may be considered that some of memory cells have threshold voltages corresponding to data of "01", and remaining memory cells have threshold voltages corresponding to data of "00" at step S1611. As a result, it is impossible to specify a degree to which the program operation has been completed. Therefore, the selected page may be an irrecoverable page. Accordingly, the storage device may process the selected page as a failed page by performing a reprogram operation of storing garbage data in the selected page. Thereafter, the storage device may perform a program operation of storing program data in another page.

In an embodiment, the garbage data may be data for which the read operation on a failed page, which is a page to which garbage data is programmed, always fails. In various embodiments, the garbage data may be generated such that program disturbance is minimized. That is, the garbage data may be data that minimizes the occurrence of program disturbance, among pieces of data which guarantee a failure in a read operation on the failed page. For example, the garbage data may be data in which all pieces of data have a value of '1'.

At step S1613, the storage device may store failed page information indicating that the selected page is a failed page. In an embodiment, the failed page information may be stored in a spare area of the failed page or in a system info area of a memory block including the failed page.

At step S1615, the storage device may store LSB data which is read using the default LSB read voltage VRD2. The stored data may be LSB data of program data which was being programmed before the sudden power off occurs.

At step S1617, the storage device may read data using the default MSB read voltages VRD1 and VRD3.

At step S1619, the storage device may determine whether the read operation using the default MSB read voltages VRD1 and VRD3 has passed.

When it is determined that the read operation using the default MSB read voltages VRD1 and VRD3 has failed, it can be seen that each of the memory cells in the selected page has any one of threshold voltages corresponding to "11", "01", and "00" and cannot be programmed to data of "10". As a result, it is impossible to specify a degree to which the program operation has been completed. Therefore, the selected page may be an irrecoverable page. Therefore, the storage device proceeds to step S1611 where the selected page may be processed as a failed page by performing a reprogram operation of storing garbage data in the selected page. Thereafter, the storage device may perform a program operation of storing program data in another page.

At step S1621, the storage device may store MSB data because the read operation using the default MSB read voltages VRD1 and VRD3 has passed. The MSB data may be MSB data of program data which was being programmed before the sudden power off occurs.

At step S1623, the selected page may be read using the upper MSB read voltage VRD3+.

At step S1625, the storage device may determine whether the read operation using the upper MSB read voltage VRD3+ has passed.

When it is determined that the read operation has passed, the corresponding program operation is considered to be completed and is then terminated because the sudden power off has occurred after the threshold voltages of the memory cells reached target threshold voltages. When the read operation fails, the process proceeds to step S1627.

At step S1627, the storage device may generate modified program data. In detail, the storage device may generate modified program data by changing the program data to be stored in memory cells, which are read as off-cells as a result of reading using the upper MSB read voltage VRD3+, to have a value of '1'. The storage device may perform a reprogram operation on the selected page using the modified program data.

Figure 17:
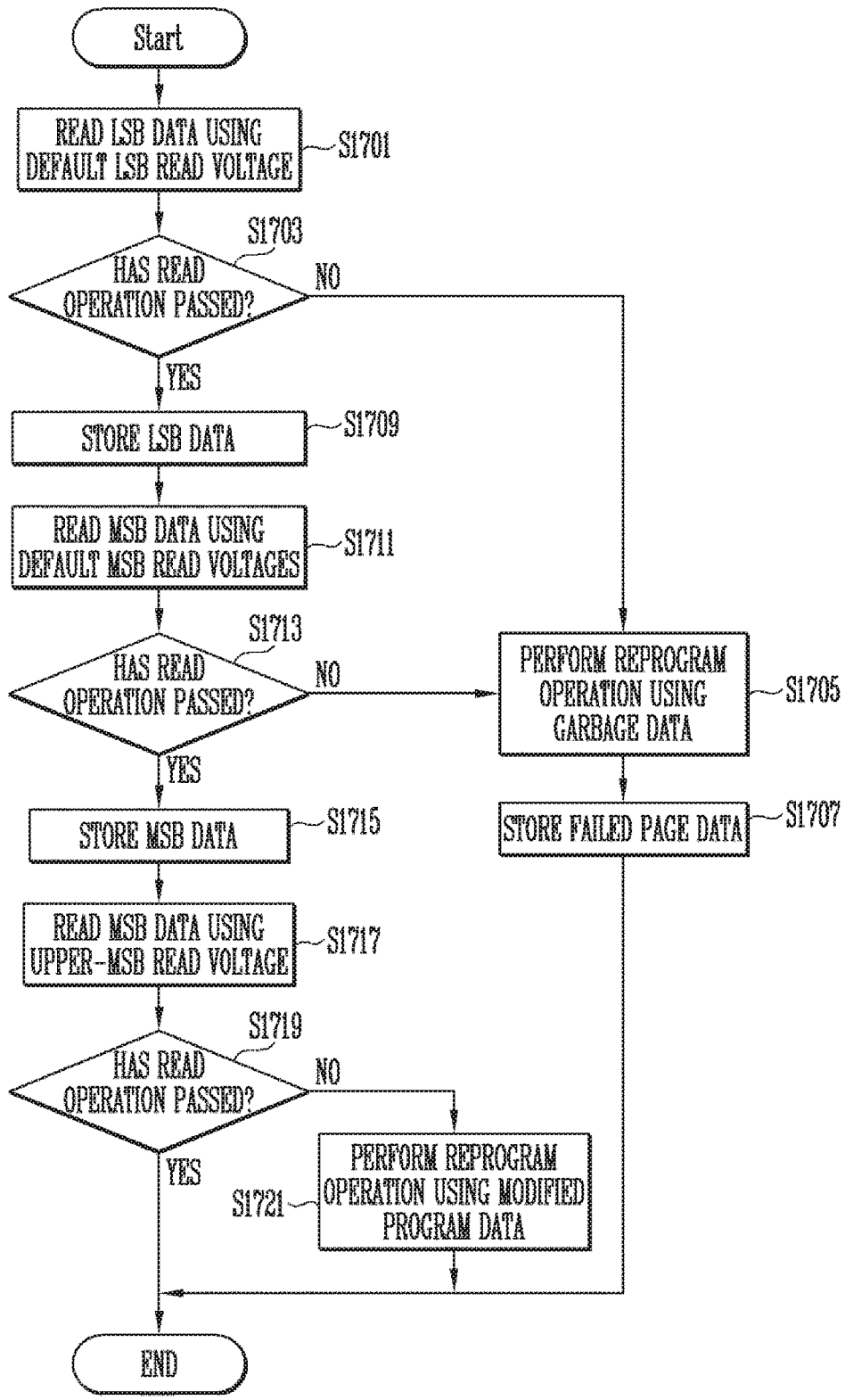
FIG. 17 is a flowchart illustrating a method for operating a storage device in accordance with an embodiment of the present disclosure.

FIG. 17 is a flowchart illustrating a method for operating a storage device in accordance with an embodiment of the present disclosure.

Referring to FIG. 17, at step S1701, the storage device may read a selected page using a default LSB read voltage VRD2.

At step S1703, the storage device may determine whether the read operation using the default LSB read voltage VRD2 has passed. When it is determined that the read operation has passed, the process proceeds to step S1709, otherwise the process proceeds to step S1705.

When the read operation using the default LSB read voltage VRD2 fails, the threshold voltage of each of the memory cells may have a voltage level corresponding to data of "11" or "01" at step S1705. As a result, it is impossible to specify a degree to which a program operation has been completed. Therefore, the selected page may be an irrecoverable page. Accordingly, the storage device may process the selected page as a failed page by performing a reprogram operation of storing garbage data in the selected page. Thereafter, the storage device may perform a program operation of storing program data in another page.

In an embodiment, the garbage data may be data for which the read operation on a failed page, which is a page to which garbage data is programmed, always fails. In various embodiments, the garbage data may be generated such that program disturbance is minimized. That is, the garbage data may be data that minimizes the occurrence of program disturbance, among pieces of data which guarantee a failure in a read operation on the failed page. For example, the garbage data may be data in which all pieces of data have a value of '1'.

At step S1707, the storage device may store failed page information indicating that the selected page is a failed page. In an embodiment, the failed page information may be stored in a spare area of the failed page or in a system info area of a memory block including the failed page.

At step S1709, the storage device may store LSB data which is read using the default LSB read voltage VRD2. The stored data may be LSB data of program data which was being programmed before the sudden power off occurs.

At step S1711, the storage device may read data using default MSB read voltages VRD1 and VRD3.

At step S1713, the storage device may determine whether the read operation using the default MSB read voltages VRD1 and VRD3 has passed.

When it is determined that the read operation using the default MSB read voltages VRD1 and VRD3 has failed, it can be seen that each of the memory cells in the selected page has any one of threshold voltages corresponding to "11", "01", and "00" and cannot be programmed to data of "10". As a result, it is impossible to specify a degree to which the program operation has been completed. Therefore, the selected page may be an irrecoverable page. Therefore, the storage device proceeds to step S1705 where the selected page may be processed as a failed page by performing a reprogram operation of storing garbage data in the selected page. Thereafter, the storage device may perform a program operation of storing program data in another page.

At step S1715, the storage device may store MSB data because the read operation using the default MSB read voltages VRD1 and VRD3 has passed. The MSB data may be MSB data of program data which was being programmed before the sudden power off occurs.

At step S1717, the selected page may be read using the upper MSB read voltage VRD3+.

At step S1719, the storage device may determine whether the read operation using the upper MSB read voltage VRD3+ has passed. When it is determined that the read operation has passed, the corresponding program operation is considered to be completed and is then terminated because the sudden power off has occurred after the threshold voltages of the memory cells reached target threshold voltages. When the read operation fails, the process proceeds to step S1721.

At step S1721, the storage device may generate modified program data. In detail, the storage device may generate modified program data by changing the program data to be stored in memory cells, which are read as off-cells as a result of reading using the upper MSB read voltage VRD3+, to have a value of '1'. The storage device may perform a reprogram operation on the selected page using the modified program data.

Figure 18:
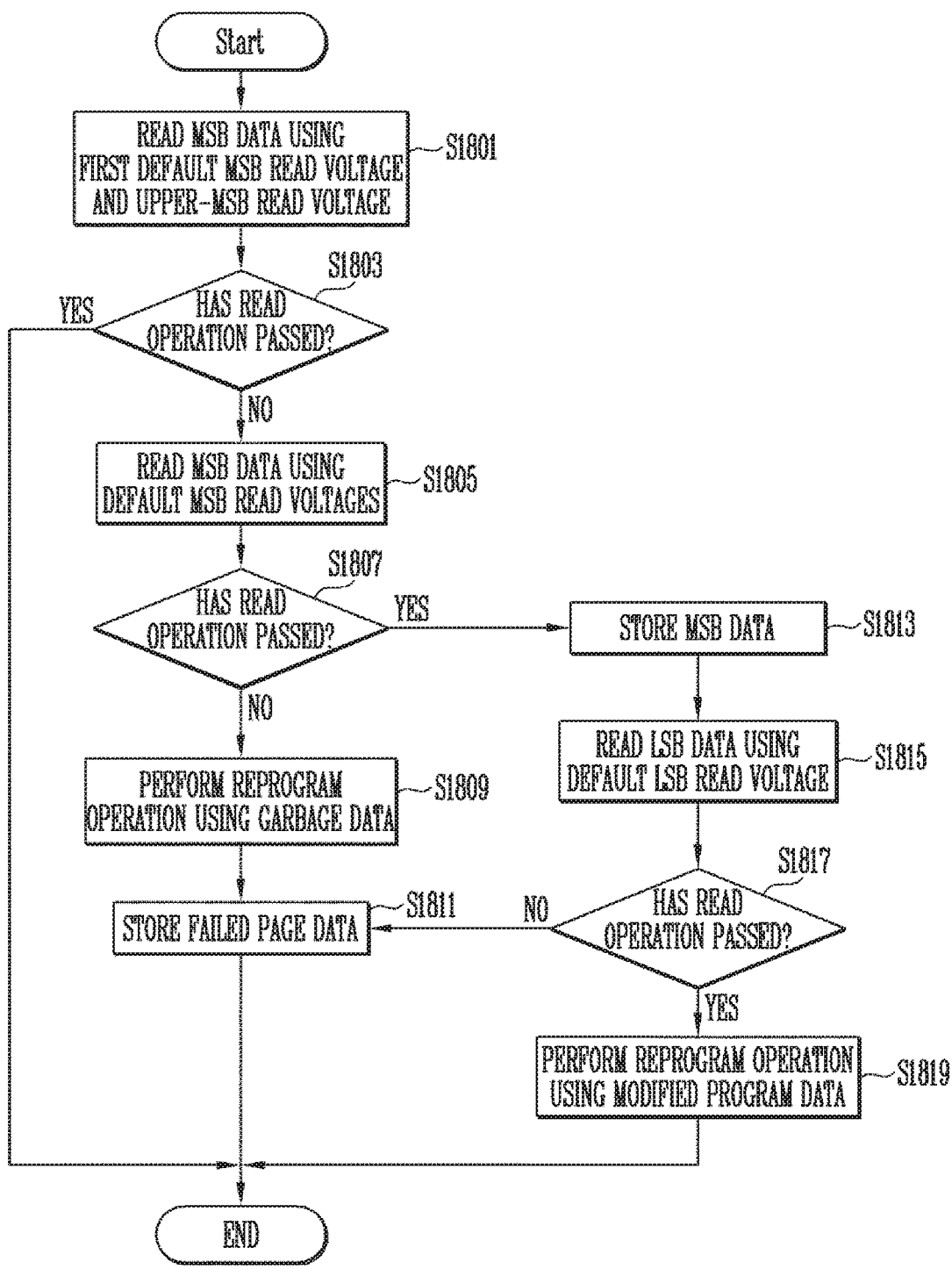
FIG. 18 is a flowchart illustrating a method for operating a storage device in accordance with an embodiment of the present disclosure.

FIG. 18 is a flowchart illustrating a method for operating a storage device in accordance with an embodiment of the present disclosure.

Referring to FIG. 18, at step S1801, the storage device may read a selected page using a first default MSB read voltage VRD1 and an upper MSB read voltage VRD3+.

At step S1803, the storage device may determine whether the read operation using the first default MSB read voltage VRD1 and the upper MSB read voltage VRD3+ has passed.

When it is determined that the read operation has passed, it may be considered that a program operation on memory cells included in the corresponding page has been normally terminated, and thus the program operation may be terminated. When it is determined that the read operation has failed, the process proceeds to step S1805.

At step S1805, the storage device may read the selected page using default MSB read voltages VRD1 and VRD3.

At step S1807, the storage device may determine whether the read operation using the default MSB read voltages VRD1 and VRD3 has passed. When it is determined that the read operation has passed, the process proceeds to step S1813, otherwise the process proceeds to step S1809.

At step S1809, the storage device may process the selected page as a failed page by performing a reprogram operation of storing garbage data in the selected page. Thereafter, the storage device may perform a program operation of storing program data in another page.

At step S1811, the storage device may store failed page information indicating that the selected page is a failed page. In an embodiment, the failed page information may be stored in a spare area of the failed page or in a system info area of a memory block including the failed page.

At step S1813, the storage device may store MSB data because the read operation using the default MSB read voltages VRD1 and VRD3 has passed. The MSB data may be MSB data of program data which was being programmed before a sudden power off occurs.

At step S1815, the storage device may read the selected page using a default LSB read voltage VRD2.

At step S1817, the storage device may determine whether the read operation using the default LSB read voltage VRD2 has passed. When it is determined that the read operation has passed, the process proceeds to step S1819, otherwise the process proceeds to step S1811.

At step S1819, the storage device may generate modified program data. In detail, the storage device may generate modified program data by changing the program data to be stored in memory cells, which are read as off-cells as a result of reading using the default LSB read voltage VRD2, to have a value of '1'. The storage device may perform a reprogram operation on the selected page using the modified program data.

Figure 19:
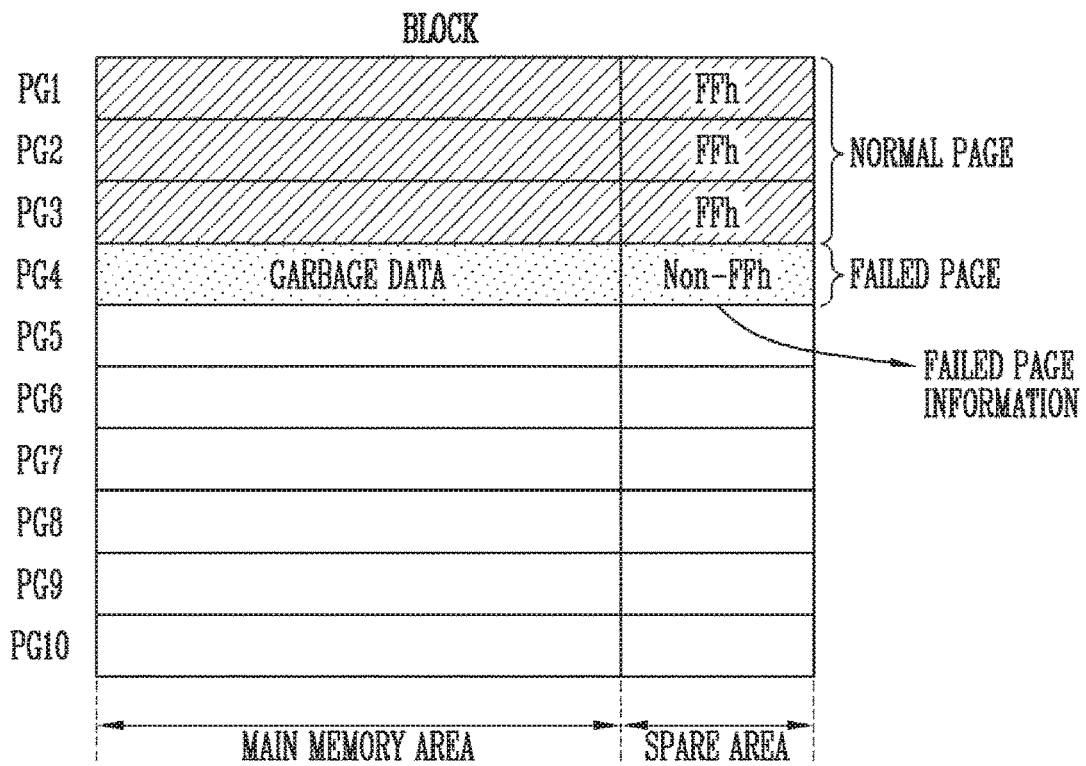
FIG. 19 is a diagram illustrating an embodiment in which failed data is stored.

FIG. 19 is a diagram illustrating an embodiment in which failed page information is stored.

Referring to FIG. 19, the storage device may store garbage data when the corresponding page is an irrecoverable page, based on the threshold voltages of memory cells included in a page on which a program operation is interrupted. Here, the storage device may store failed page information indicating that the corresponding page is a failed page in which the garbage data is stored, together with the garbage data.

In detail, a memory block may be divided into a main memory area in which data is stored and a spare area in which spare information is stored. A single page includes both the main memory area and the spare area. The spare area may store information related to data stored in the main memory area. For example, the spare area may store parity information of the data stored in the main memory area. Alternatively, the spare area may store address information of data stored in the main memory area.

In an embodiment of the present disclosure, failed page information may be stored in the spare area. That is, the storage device may store failed page information, indicating that the corresponding page is a failed page, in the spare area of the page when a reprogram operation of storing garbage data is performed. In an embodiment, the failed page may be a flag implemented as a one bit.

Figure 20:
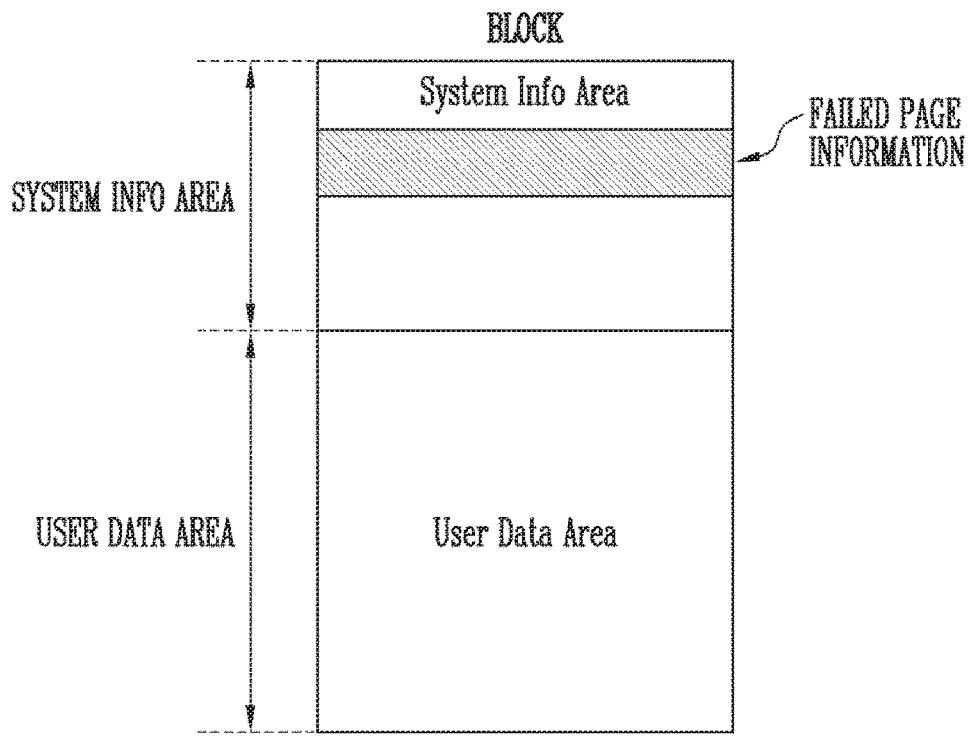
FIG. 20 is a diagram illustrating an embodiment in which failed data is stored.

FIG. 20 is a diagram illustrating an embodiment in which failed page information is stored.

Referring to FIG. 20, a memory block may be divided into a system information area in which system information is stored and a user data area in which user data is stored. The system information area stores the system information. The system information may be information in an area which cannot be directly accessed by a user. In an embodiment, the system information area may include an SLC block in which one bit of data is stored in each memory cell. The user data area may include an MLC block or a TLC block which two bits or three bits of data are stored in each memory cell.

In accordance with the embodiment of the present disclosure, the storage device may store failed page information, indicating information about failed pages included in the corresponding memory block, in the system information area.

Figure 21:
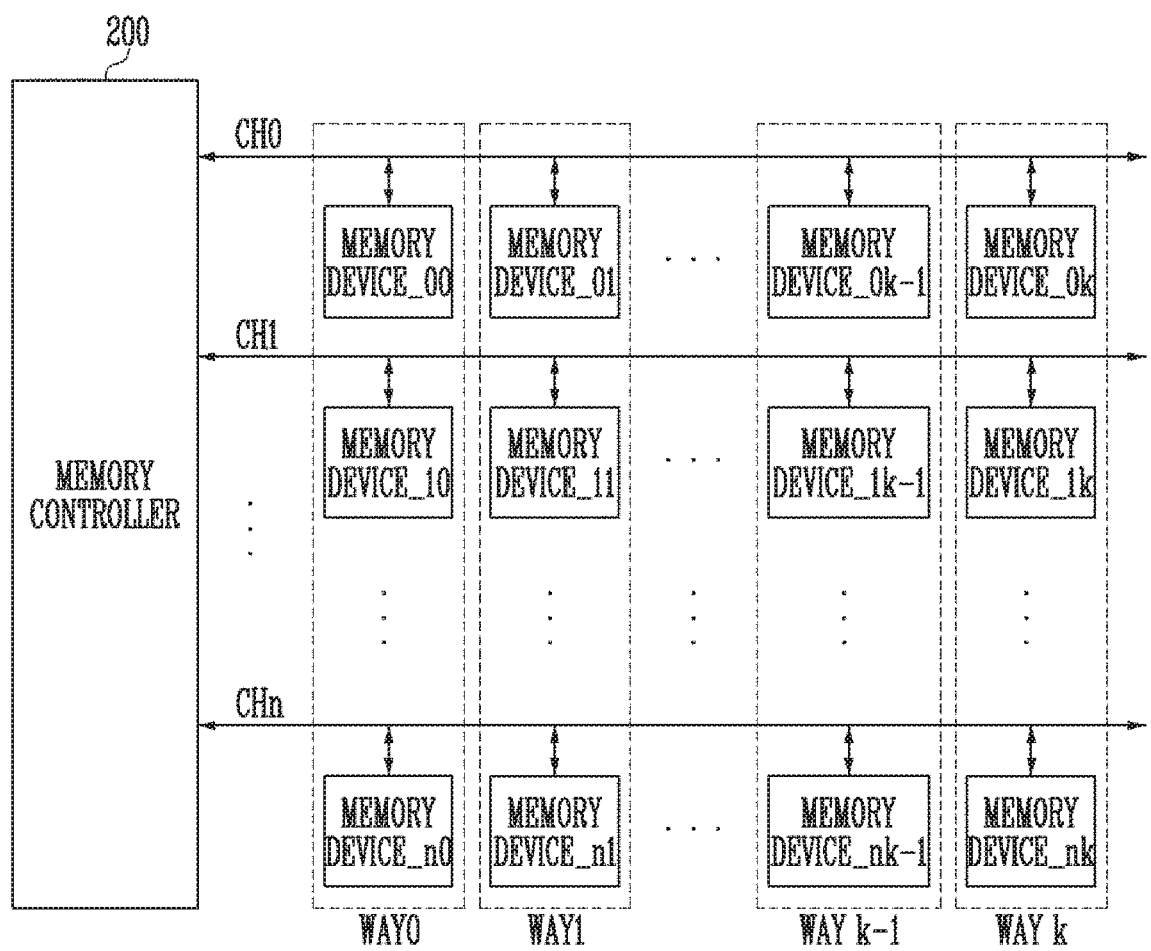
FIG. 21 is a block diagram illustrating coupling relationships between the memory controller of FIG. 1 and a plurality of memory devices.

FIG. 21 is a block diagram illustrating coupling relationships between the memory controller of FIG. 1 and a plurality of memory devices.

Referring to FIG. 21, a memory controller 200 may be coupled to a plurality of memory devices (e.g., memory device_00 to memory device_nk) through a plurality of channels CH0 to CHk. In an embodiment, it should be understood that the number of channels or the number of memory devices coupled to each channel may be variously changed.

The memory device_00 to the memory device_0k may be coupled in common to the channel 0 CH0. The memory device_00 to the memory device_0k may communicate with the memory controller 200 through the channel 0 CH0.

Since the memory device_00 to the memory device_0k are coupled in common to the channel 0 CH0, only a single memory device may communicate with the memory controller 200 at one time. However, the memory device_00 to the memory device_0k may simultaneously perform their own internal operations.

The memory devices coupled to each of the channel 1 CH1 to the channel n CHn may be operated in the same way as the memory devices coupled to the above-described channel 0 CH0.

The storage device which uses a plurality of memory devices may improve performance using data interleaving that is data communication using an interleaving scheme. Data interleaving may be configured to perform a data read or write operation while shifting to each way in a structure in which two or more ways share a single channel with each other. For data interleaving, the memory devices may be managed on a way basis together with channels. In order to maximize parallelism of memory devices coupled to each channel, the memory controller 200 may distribute and allocate consecutive logical memory areas to channels and ways.

For example, the memory controller 200 may transmit commands, control signals including addresses, and data to the memory device_00 through the channel 0 CH0. While the memory device_00 is programming the received data to memory cells included therein, the memory controller 200 may transmit commands, control signals including addresses, and data to the memory device_01.

In FIG. 21, the plurality of memory devices may be configured using k+1 ways WAY 0 to WAY k. The way 0 (WAY0) may include the memory device_00 to the memory device_n0. The memory devices included in the way 1 (WAY 1) to the way k (WAY k) may be configured in the same way as the memory devices included in the above-described WAY 0.

Each of the channels CH0 to CHn may be a bus for signals, which is shared and used by memory devices coupled to the corresponding channel.

Although data interleaving in an n-channel/k-way structure is illustrated in FIG. 21, interleaving may be more efficient as the number of channels increases and the number of ways increases.

Figure 22:
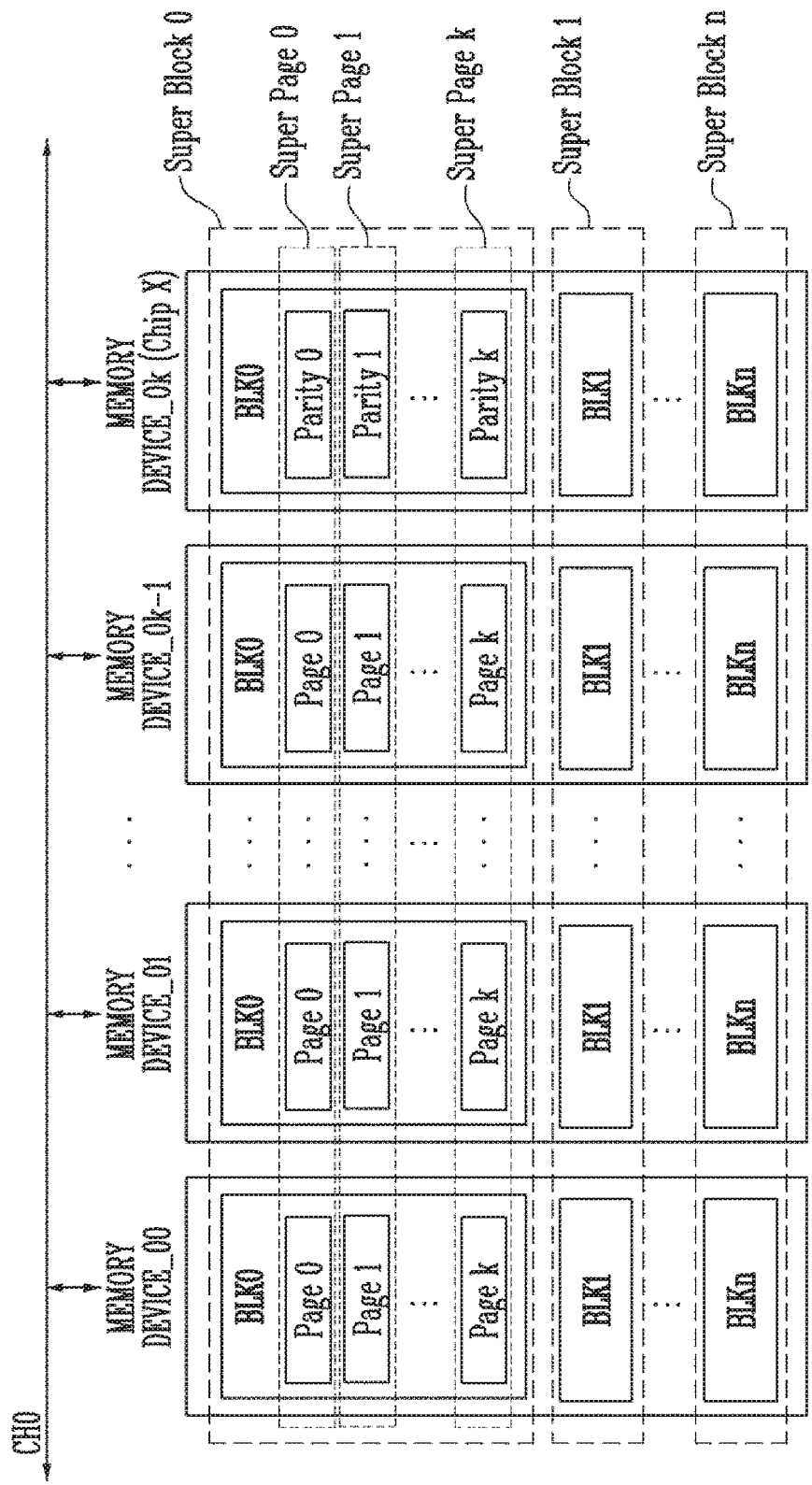
FIG. 22 is a diagram of parity data for a storage device.

FIG. 22 is a diagram illustrating parity data for a storage device.

Referring to FIG. 22, memory device_00 to memory device_0k may be coupled in common to channel 0 CH0.

In FIG. 22, each of the memory devices may include a 0-th memory block to an n-th memory block BLK0 to BLKn, and each of the memory blocks may include a 0-th page to a k-th page 0 to Page k.

The memory controller may control the memory blocks, included in a plurality of memory devices coupled in common to a single channel, on a super block basis. For example, the 0-th memory blocks included in the memory device_00 to the memory device_0k may constitute a 0-th super block (Super Block 0). Therefore, the memory device_00 to the memory device_0k coupled to the channel 0 CH0 may include 0-th to n-th super blocks (Super block 0 to Super Block n).

A single super block may include a plurality of super pages.

A single super page may include a plurality of pages. For example, the 0-th pages (Page 0), respectively included in the plurality of 0-th memory blocks BLK0 included in the 0-th super block (Super Block 0), may constitute a 0-th super page (Super page 0).

Therefore, the 0-th super page (Super Page 0) to the k-th super page (Super Page k) may be included in a single super block.

The memory controller may store or read data on a super page basis when storing data in the memory device_00 to the memory device_0k or reading the stored data therefrom.

In this case, the program operation of storing data in a single super page or the read operation of reading the stored data may be performed using data interleaving.

The memory device_0k (Chip X) may store parity data. In detail, the memory device_0k may store parity data generated by performing an exclusive OR (XOR) operation on pieces of data stored in the memory device_00 to the memory device_0k–1.

For example, the 0-th page of the 0-th memory block BLK0 in the memory device_0k may store parity data generated by performing an XOR operation on pieces of data respectively stored in the 0-th pages of the 0-th memory blocks BLK0 in the memory device_00 to the memory device_0k–1.

When it is determined, using the parity data, that any one of a plurality of pieces of page data included in a single super page fails to be read, the memory controller may recover the page data, which is stored in the memory device having failed in the read operation, by performing an XOR operation on the remaining pieces of page data and the parity data.

Figure 23:
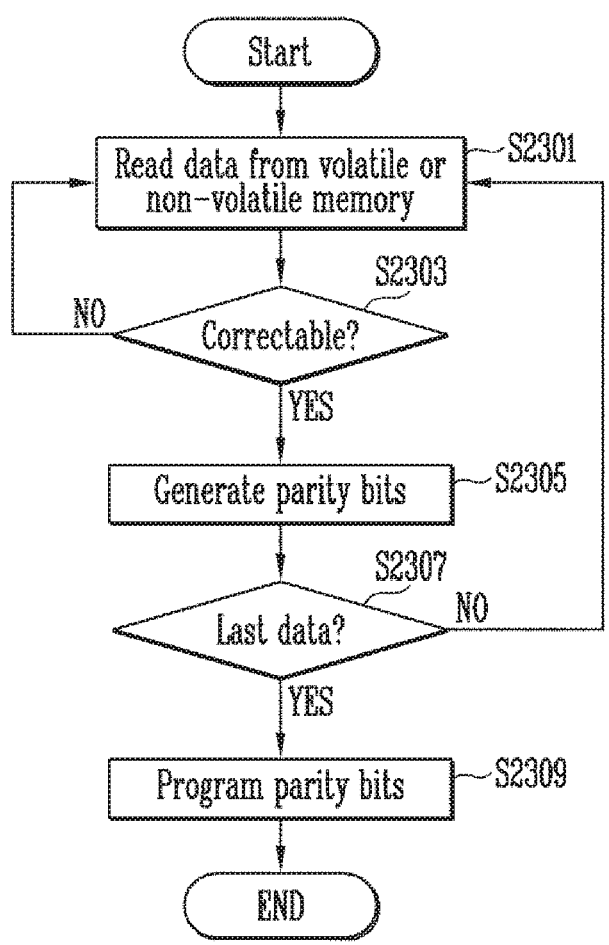
FIG. 23 is a diagram illustrating a method of generating parity data for a storage device in accordance with an embodiment of the present disclosure.

FIG. 23 is a diagram illustrating a method by which a memory controller included in a storage device generates parity data in accordance with an embodiment of the present disclosure.

In FIG. 23, the memory controller generates parity data for pieces of page data stored in a single super page.

Referring to FIG. 23, at step S2301, the memory controller may read page data to be programmed, which is included in a buffer memory (e.g., volatile memory), or may read pieces of page data stored in a plurality of memory devices.

At step S2303, the memory controller may determine whether the number of error bits included in the read data is greater than the maximum number of correctable error bits. When it is determined that the number of error bits included in the read data is greater than the maximum number of correctable error bits, the process returns to step S2301 where data corresponding to a subsequent page may be read. When it is determined that the number of error bits included in the read data is not greater than the maximum number of correctable error bits, and the data is normally read, the process proceeds to step S2305. In an irrecoverable page described above with reference to FIGS. 7 to 18, garbage data is stored, and thus the corresponding page may fail to be read. Therefore, for data failed to be read, the memory controller may not involve the corresponding data in the generation of parity data at steps S2305 to S2309.

At step S2305, the memory controller may generate parity bits for the page data.

At step S2307, the memory controller may determine whether the corresponding page data is the last data included in the single super page. When it is determined that the page data is not the last data, the process returns to step S2301 where data corresponding to a subsequent page may be read. When it is determined that the page data is the last page data, the process proceeds to step S2309.

At step S2309, the memory controller may program parity data including the generated parity bits.

Figure 24:
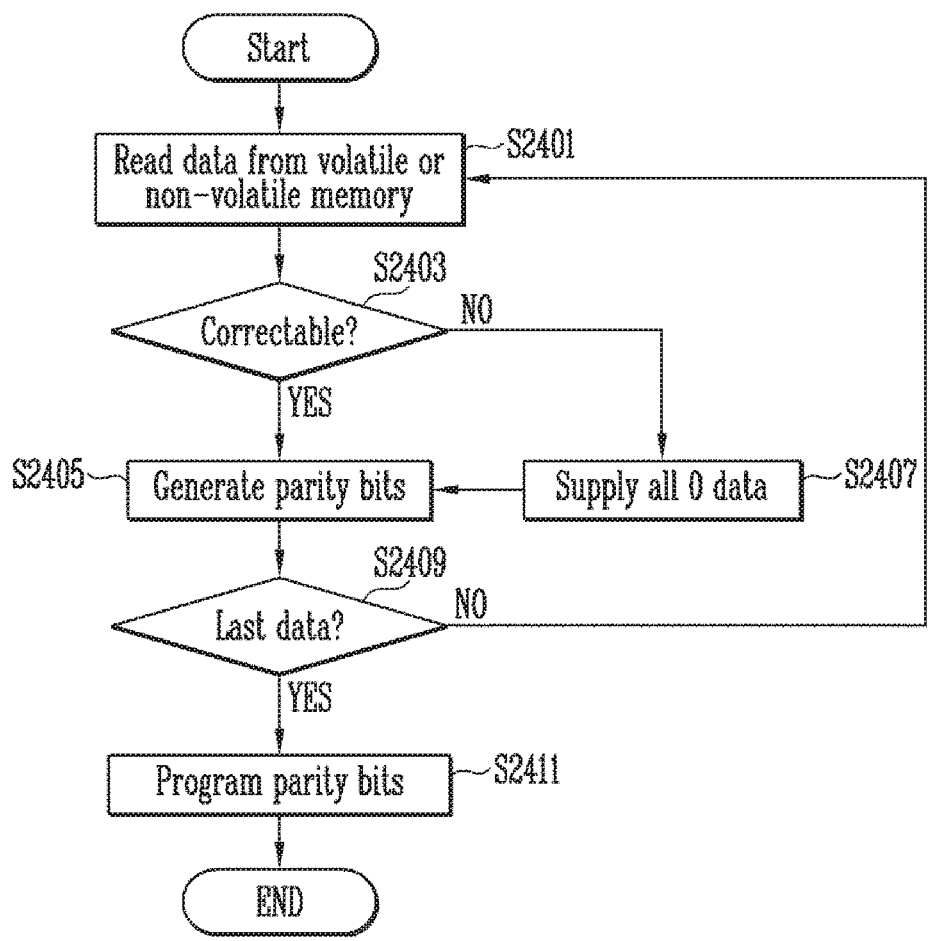
FIG. 24 is a diagram illustrating a method of generating parity data for a storage device in accordance with an embodiment of the present disclosure.

FIG. 24 is a diagram illustrating a method for generating parity data for a storage device in accordance with an embodiment of the present disclosure.

In FIG. 24, a memory controller generates parity data for pieces of page data stored in a single super page.

Referring to FIG. 24, at step S2401, the memory controller may read page data to be programmed, which is included in a buffer memory (e.g., volatile memory), or may read pieces of page data stored in a plurality of memory devices.

At step S2403, the memory controller may determine whether the number of error bits included in the read data is greater than the maximum number of correctable error bits. When it is determined that the number of error bits included in the read data is greater than the maximum number of correctable error bits, the process proceeds to step S2407, whereas when it is determined that the number of error bits included in the read data is not greater than the maximum number of correctable error bits, and the data is normally read, the process proceeds to step S2405.

In an irrecoverable page described above with reference to FIGS. 7 to 18, garbage data is stored, and thus the corresponding page may fail to be read. Therefore, the memory controller proceeds to step S2407 for the data failed to be read, where dummy data in which all data bits are "0" may be treated as read page data.

At step S2405, the memory controller may generate parity bits for the page data.

At step S2409, the memory controller may determine whether the corresponding page data is the last data included in the single super page. When it is determined that the page data is not the last data, the process returns to step S2401 where data corresponding to a subsequent page may be read. When it is determined that the page data is the last page data, the process proceeds to step S2411.

At step S2411, the memory controller may program parity data including the generated parity bits.

Figure 25:
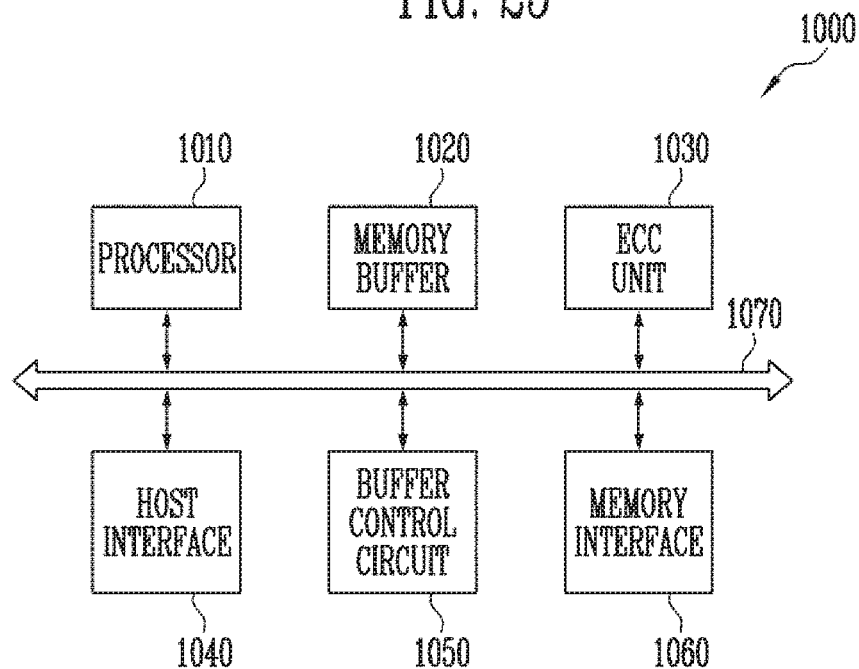
FIG. 25 is a diagram illustrating an embodiment of the memory controller of FIG. 1.

FIG. 25 is a diagram illustrating an embodiment of the memory controller 200 of FIG. 1.

A memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 25, the memory controller 1000 may include a processor 1010, a memory buffer 1020, an error checking and correction unit (ECC) unit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processing unit 1010 may use a randomizing seed to randomize data received from the host. The randomized data may be provided, as data to be stored, to the memory device and may be programmed in the memory cell array.

The processor may derandomize data received from the memory device during a read operation. For example, the processor 1010 may derandomize the data received from the memory device using a derandomizing seed. The derandomized data may be outputted to the host.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC unit 1030 may perform error correction. The ECC unit 1030 may perform error correction code (ECC) encoding based on data to be written to the memory device through the memory interface 1060. The ECC-encoded data may be transferred to the memory device through the memory interface 1060. The ECC unit 1030 may perform ECC decoding based on data received from the memory device through the memory interface 1060. In an example, the ECC unit 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC unit 1030, and the memory interface 1060. The control bus may be coupled to the host interface 1040, the processor 1010, the buffer control circuit 1050, the memory buffer 1020, and the memory interface 1060.

Figure 26:
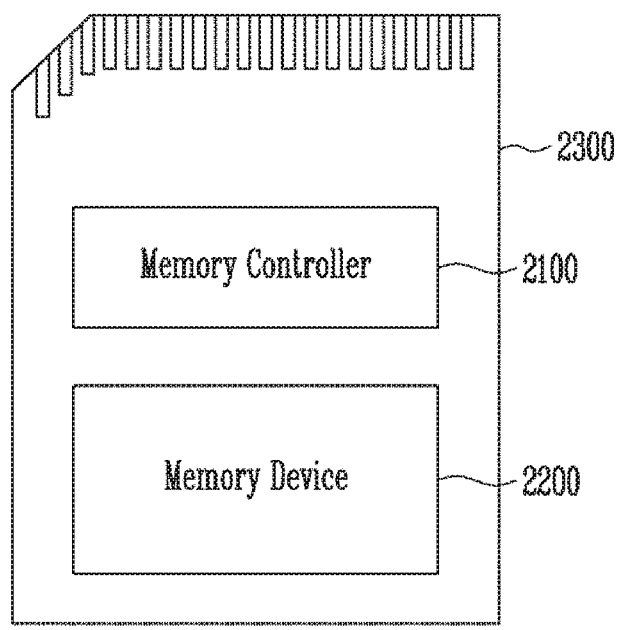
FIG. 26 is a block diagram illustrating a memory card system to which the storage device in accordance with an embodiment of the present disclosure is applied.

FIG. 26 is a block diagram illustrating a memory card system to which the storage device in accordance with an embodiment of the present disclosure is applied.

Referring to FIG. 26, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controller 200 described above with reference to FIG. 1.

In an embodiment, the memory controller 2100 may include components, such as a RAM, a processing unit, a host interface, a memory interface, and an ECC unit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin-Torque Magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 27:
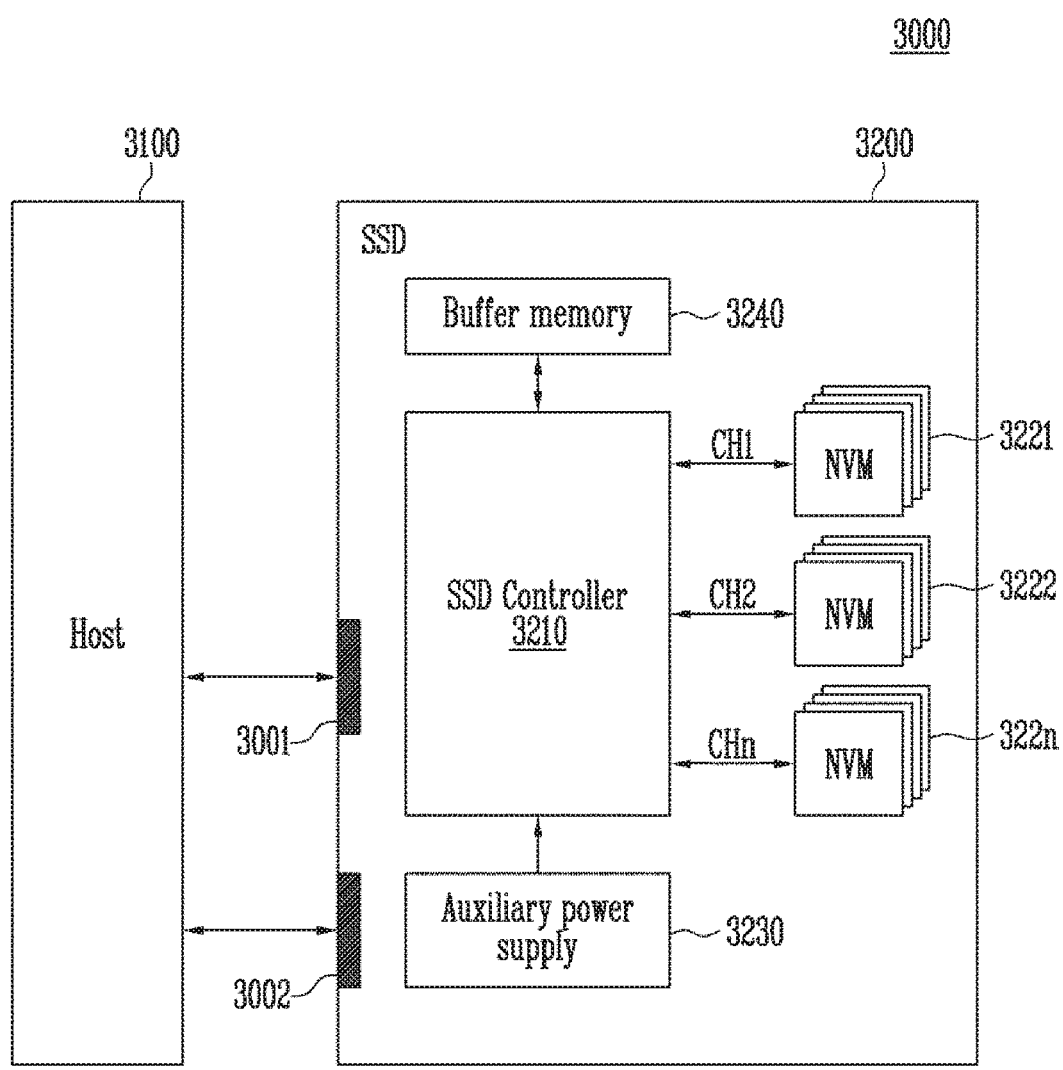
FIG. 27 is a block diagram illustrating an example of a solid state drive (SSD) system to which the storage device in accordance with an embodiment of the present disclosure is applied.

FIG. 27 is a block diagram illustrating an example of a solid state drive (SSD) system to which the storage device in accordance with an embodiment of the present disclosure is applied.

Referring to FIG. 27, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 28:
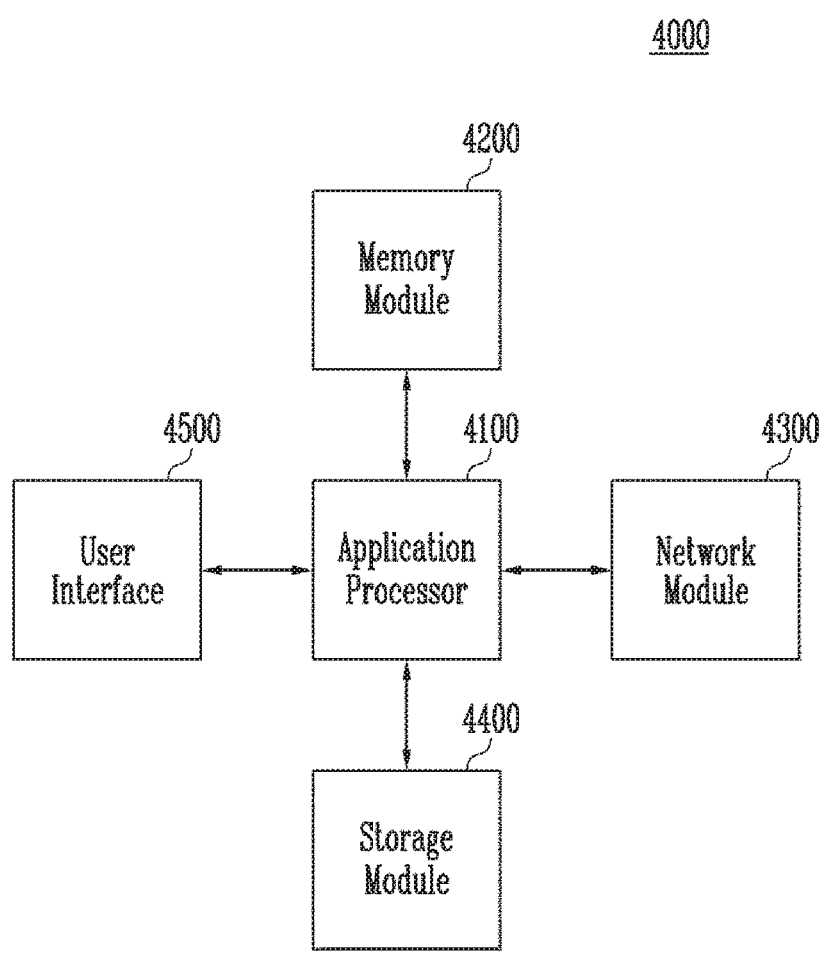
FIG. 28 is a block diagram illustrating a user system to which the storage device in accordance with an embodiment of the present disclosure is applied.

FIG. 28 is a block diagram illustrating a user system to which the storage device in accordance with an embodiment of the present disclosure is applied.

Referring to FIG. 28, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-H communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device described above with reference to FIGS. 2 to 5. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there are provided a storage device, which performs a reprogram operation on a page on which a program operation is interrupted due to a sudden power off, and a method for operating the storage device.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not always be sequentially performed in given order, and may be randomly performed. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A storage device, comprising:
a memory device including a plurality of memory blocks, each of which includes a plurality of pages; and
a memory controller configured to perform a reprogram operation on a page on which a program operation is interrupted using reprogram data that is set depending on threshold voltages of memory cells included in the page on which the program operation is interrupted, among the plurality of pages,
wherein the program operation which is interrupted and the reprogram operation are performed on the same page.

2. The storage device according to claim 1, wherein the memory controller is configured to, when the threshold voltages of the memory cells are in a state before the program operation is performed, set program data as the reprogram data, the program data being data to be stored depending on the program operation.

3. The storage device according to claim 2, wherein the state before the program operation is performed indicates a state in which the threshold voltages of the memory cells are lower than a default read voltage and are lower than a lower read voltage which is lower than the default read voltage.

4. The storage device according to claim 1, wherein the memory controller is configured to, in a case where the page on which the program operation is interrupted is an irrecoverable page, set garbage data as the reprogram data.

5. The storage device according to claim 4, wherein the garbage data is data that guarantees a failure in a read operation on a failed page to which the garbage data is programmed.

6. The storage device according to claim 4, wherein the garbage data is data generated such that a program disturbance caused by the reprogram operation is minimized.

7. The storage device according to claim 4, wherein the memory controller is configured to program the garbage data to the page on which the program operation is interrupted and to store failed page information, indicating that the garbage data is stored in the page on which the program operation is interrupted, in the memory device.

8. The storage device according to claim 7, wherein the memory controller is configured to store the failed page information in a spare area of the page on which the program operation is interrupted.

9. The storage device according to claim 7, wherein the memory controller is configured to store the failed page information in a system information area of a memory block including the page on which the program operation is interrupted.

10. The storage device according to claim 4, wherein the case where the page on which the program operation is interrupted is the irrecoverable page indicates a state in which the threshold voltages of the memory cells are lower than a default read voltage and are higher than a lower read voltage which is lower than the default read voltage.

11. The storage device according to claim 1, wherein the memory controller is configured to, in a case where the page on which the program operation is interrupted is a recoverable page, set modified program data, in which program data is modified, as the reprogram data.

12. The storage device according to claim 11, wherein the case where the page on which the program operation is interrupted is the recoverable page indicates a state in which the threshold voltages of the memory cells are higher than a default read voltage and are higher than an upper read voltage which is higher than the default read voltage.

13. The storage device according to claim 12, wherein the modified program data is data in which data to be stored in memory cells, which are read as off-cells as a result of a read operation using the upper read voltage, changes to '1' in the program data, the program data being data to be stored depending on the program operation.

14. A method for operating a storage device, the storage device including a memory device having a plurality of memory blocks, each of which includes a plurality of pages, and a memory controller for controlling the memory device, the method comprising:
performing a read operation on a page on which a program operation is interrupted, among the plurality of pages, using a default read voltage; and
performing a read operation using any one of a lower read voltage and an upper read voltage based on a result of the read operation using the default read voltage, and performing a reprogram operation based on a result of the read operation, wherein the lower read voltage has a voltage level lower than that of the default read voltage and the upper read voltage has a voltage level higher than that of the default read voltage.

15. The method according to claim 14, where performing the reprogram operation comprises:
performing a read operation on a page, on which the program operation is interrupted, using the lower read voltage when the read operation using the default read voltage passes; and
setting reprogram data to be used for the reprogram operation based on a result of the read operation on the page, on which the program operation is interrupted, using the lower read voltage.

16. The method according to claim 15, wherein setting the reprogram data is configured to:
when a number of off-cells is greater than a reference number of off-cells as a result of the read operation using the lower read voltage, set program data as the reprogram data, the program data being data to be stored depending on the program operation.

17. The method according to claim 15, wherein setting the reprogram data is configured to, when a number of off-cells is not greater than a reference number of off-cells as a result of the read operation using the lower read voltage, set garbage data to be the reprogram data.

18. The method according to claim 14, where performing the reprogram operation comprises:
when the read operation using the default read voltage fails, performing a read operation on the page, on which the program operation is interrupted, using the upper read voltage; and
setting reprogram data to be used for the reprogram operation based on a result of the read operation on the page, on which the program operation is interrupted, using the upper read voltage.

19. The method according to claim 18, wherein setting the reprogram data is configured such that, when the read operation using the upper read voltage fails, data in which data to be stored in memory cells, which are read as off-cells as a result of the read operation using the upper read voltage, changes to '1' in program data and is set as the reprogram data, the program data being data to be stored depending on the program operation.

20. A storage device, comprising:
a memory device configured to perform a program operation of storing program data in a page selected from among a plurality of pages; and
a memory controller configured to, when the program operation is interrupted due to a sudden power off, control the memory device such that any one of garbage data, the program data, and modified program data in which part of the program data is modified is stored in the selected page based on a result of reading the selected page using at least two of a default read voltage, a lower read voltage having a voltage level lower than that of the default read voltage, and an upper read voltage having a voltage level higher than that of the default read voltage.

* * * * *